(12) United States Patent
Krietzman et al.

(10) Patent No.: US 11,678,458 B1
(45) Date of Patent: Jun. 13, 2023

(54) SLIDABLE MOUNTING HARDWARE FOR ELECTRONIC EQUIPMENT ENCLOSURE AND METHOD FOR INSTALLING SAME

(71) Applicant: CHATSWORTH PRODUCTS, INC., Simi Valley, CA (US)

(72) Inventors: William Drew Krietzman, Rathdrum, ID (US); Preston Ellis Hennrich, Leander, TX (US)

(73) Assignee: Chatsworth Products, Inc., Simi Valley, CA (US)

( * ) Notice: Subject to any disclaimer, the term of this patent is extended or adjusted under 35 U.S.C. 154(b) by 0 days.

(21) Appl. No.: 17/662,174

(22) Filed: May 5, 2022

Related U.S. Application Data

(63) Continuation of application No. 17/550,976, filed on Dec. 14, 2021.
(Continued)

(51) Int. Cl.
  *H05K 7/14* (2006.01)
  *F16B 37/04* (2006.01)

(52) U.S. Cl.
  CPC ......... *H05K 7/1489* (2013.01); *F16B 37/044* (2013.01)

(58) Field of Classification Search
  CPC ... H05K 7/1489; F16B 37/044; F16B 37/045; F16B 37/046; F16B 7/187; F16B 12/32; F16B 12/20; F16B 35/04; F16B 35/06
  See application file for complete search history.

(56) References Cited

U.S. PATENT DOCUMENTS

| | | |
|---|---|---|
| 1,564,611 A | 12/1925 | Mountford et al. |
| 1,589,613 A | 6/1926 | Mountford et al. |
| | (Continued) | |

FOREIGN PATENT DOCUMENTS

| | | |
|---|---|---|
| CN | 102177633 A | 9/2011 |
| CN | 108431433 A | 8/2018 |
| | (Continued) | |

OTHER PUBLICATIONS

Information Disclosure Statement (IDS) Letter Regarding Common Patent Application(s), dated Sep. 12, 2022.
(Continued)

*Primary Examiner* — Christopher M Koehler
(74) *Attorney, Agent, or Firm* — Tillman Wright, PLLC; James D. Wright; David R. Higgins

(57) ABSTRACT

A method of securing a structure against a slide-type mounting rail of an electronic equipment enclosure includes: providing a hardware assembly having a spring retainer and bolt, a head of which is received at least partially within the spring retainer; positioning the hardware assembly within a T-slot channel of the slide-type mounting rail such that bent edges of deflectable spring arms engage ledges of the T-slot channel to prevent the retainer from rotation; configuring the bolt from an unlocked position to a locked position by rotating the bolt a quarter turn relative to the retainer to position the head transversely within the channel, thereby obstructing the hardware assembly from inadvertent removal from the slide-type mounting rail; placing the structure against the slide-type mounting rail such that a shaft extends through an aperture; and tightening a nut onto the shaft such that the nut is pressed firmly against the structure.

25 Claims, 31 Drawing Sheets

Related U.S. Application Data

(60) Provisional application No. 63/125,489, filed on Dec. 15, 2020.

(56) References Cited

U.S. PATENT DOCUMENTS

| | | | |
|---|---|---|---|
| 2,206,739 A | 7/1940 | Brogren et al. | |
| 2,390,752 A | 12/1945 | Tinnerman | |
| 2,406,415 A | 8/1946 | Tinnerman | |
| 2,426,799 A | 9/1947 | Tinnerman | |
| 2,430,555 A | 11/1947 | Burke | |
| 2,495,037 A * | 1/1950 | Tinnerman | F16B 37/044 |
| | | | 29/509 |
| 2,695,046 A | 11/1954 | Tinnerman, III | |
| 2,724,419 A | 11/1955 | Poupitch | |
| 2,875,804 A * | 3/1959 | Flora | F16B 37/044 |
| | | | 411/427 |
| 3,019,409 A | 1/1962 | Sarafinas | |
| 3,034,844 A | 5/1962 | Anderson et al. | |
| 3,035,624 A * | 5/1962 | Jaworski | F16B 37/044 |
| | | | 411/112 |
| 3,192,823 A | 7/1965 | Munse | |
| 3,247,312 A | 4/1966 | Allessi | |
| 3,404,931 A | 10/1968 | Fall et al. | |
| 3,486,158 A | 12/1969 | Soltysik et al. | |
| 3,563,627 A | 2/1971 | Whipps | |
| 3,655,254 A | 4/1972 | Mayer et al. | |
| 3,778,932 A | 12/1973 | Ewing | |
| 3,810,069 A | 5/1974 | Jaconette, Jr. | |
| 4,040,694 A | 8/1977 | Lascarrou | |
| 4,045,104 A | 8/1977 | Peterson | |
| 4,101,233 A | 7/1978 | McConnell | |
| 4,417,366 A | 11/1983 | Salice | |
| 4,473,166 A | 9/1984 | Breiter | |
| 4,497,411 A | 2/1985 | DeBortoli | |
| 4,553,674 A | 11/1985 | Koshikawa et al. | |
| 4,575,295 A * | 3/1986 | Rebentisch | F16B 37/046 |
| | | | 411/85 |
| 4,613,174 A | 9/1986 | Berg et al. | |
| 4,620,392 A | 11/1986 | Kerpers et al. | |
| 4,643,319 A | 2/1987 | Debus et al. | |
| 4,723,749 A | 2/1988 | Carrara et al. | |
| 4,796,541 A | 1/1989 | Halstrick | |
| 4,803,756 A | 2/1989 | Hufnagel | |
| 4,941,717 A | 7/1990 | Beaulieu | |
| 4,966,563 A | 10/1990 | Pierce et al. | |
| 4,974,289 A | 12/1990 | Piard | |
| 4,993,959 A | 2/1991 | Randolph | |
| 5,009,383 A | 4/1991 | Chapman | |
| 5,020,866 A | 6/1991 | McIlwraith | |
| 5,054,978 A * | 10/1991 | Kowalski | F16B 37/046 |
| | | | 411/432 |
| 5,067,863 A * | 11/1991 | Kowalski | F16B 37/046 |
| | | | 411/432 |
| 5,078,537 A * | 1/1992 | Nomura | F16B 37/046 |
| | | | 411/84 |
| 5,147,121 A | 9/1992 | McIlwraith | |
| 5,165,770 A | 11/1992 | Hahn | |
| 5,199,836 A * | 4/1993 | Gogarty | F16B 37/045 |
| | | | 411/84 |
| 5,228,762 A | 7/1993 | Mascrier | |
| RE34,393 E | 9/1993 | McIlwraith | |
| 5,271,586 A * | 12/1993 | Schmidt | F16B 37/046 |
| | | | 248/68.1 |
| 5,294,748 A | 3/1994 | Schwenk et al. | |
| 5,372,262 A | 12/1994 | Benson et al. | |
| 5,380,083 A | 1/1995 | Jones et al. | |
| 5,388,903 A | 2/1995 | Jones et al. | |
| 5,391,084 A | 2/1995 | Krietzman | |
| 5,441,337 A | 8/1995 | Mazura et al. | |
| 5,536,079 A | 7/1996 | Kostic | |
| 5,561,886 A | 10/1996 | Flamme | |
| 5,570,940 A | 11/1996 | Maro | |
| 5,593,046 A | 1/1997 | Katsuura et al. | |
| 5,624,319 A | 4/1997 | Golczyk et al. | |
| 5,639,150 A | 6/1997 | Anderson et al. | |
| 5,728,973 A | 3/1998 | Jorgensen | |
| 5,788,351 A | 8/1998 | Prunty et al. | |
| 5,791,498 A | 8/1998 | Mills | |
| 5,806,945 A | 9/1998 | Anderson et al. | |
| 5,833,417 A * | 11/1998 | Sargent | F16B 37/046 |
| | | | 411/432 |
| 5,864,922 A | 2/1999 | Kraft | |
| 5,899,545 A | 5/1999 | Besserer et al. | |
| 5,926,916 A | 7/1999 | Lee et al. | |
| 5,927,368 A | 7/1999 | Rohrer et al. | |
| 5,933,563 A | 8/1999 | Schaffer et al. | |
| 5,938,302 A | 8/1999 | Anderson et al. | |
| 5,940,937 A | 8/1999 | Churchill et al. | |
| 5,975,315 A | 11/1999 | Jordan | |
| 5,983,590 A | 11/1999 | Serban | |
| 5,991,975 A | 11/1999 | Baer | |
| 5,997,117 A | 12/1999 | Krietzman | |
| 6,000,769 A | 12/1999 | Chen | |
| 6,000,771 A | 12/1999 | Wissinger et al. | |
| 6,019,446 A | 2/2000 | Laboch et al. | |
| 6,036,290 A | 3/2000 | Jancsek et al. | |
| 6,082,878 A | 7/2000 | Doubek | |
| 6,086,300 A * | 7/2000 | Frohlich | F16B 37/045 |
| | | | 411/84 |
| 6,123,203 A | 9/2000 | Gibbons | |
| 6,123,400 A | 9/2000 | Nicolai et al. | |
| 6,146,071 A * | 11/2000 | Norkus | F16B 37/044 |
| | | | 411/104 |
| 6,152,554 A | 11/2000 | Parisi | |
| 6,161,803 A | 12/2000 | Daoud | |
| 6,185,098 B1 | 2/2001 | Benavides | |
| 6,215,069 B1 | 4/2001 | Martin et al. | |
| 6,220,554 B1 | 4/2001 | Daoud | |
| 6,254,207 B1 | 7/2001 | Leneutre | |
| 6,293,637 B1 | 9/2001 | Anderson et al. | |
| 6,299,268 B1 | 10/2001 | Carle et al. | |
| 6,321,917 B1 | 11/2001 | Mendoza | |
| 6,348,655 B1 | 2/2002 | Wright | |
| 6,365,834 B1 | 4/2002 | Larsen et al. | |
| 6,401,940 B1 | 6/2002 | Hartel et al. | |
| 6,425,488 B1 | 7/2002 | Notohardjono et al. | |
| 6,425,648 B1 | 7/2002 | Notohardjono et al. | |
| 6,427,952 B2 | 8/2002 | Caveney et al. | |
| 6,428,127 B1 | 8/2002 | Rasmussen | |
| 6,431,885 B1 | 8/2002 | Stroup | |
| 6,467,633 B2 | 10/2002 | Mendoza | |
| 6,468,112 B1 | 10/2002 | Follingstad et al. | |
| 6,481,160 B1 | 11/2002 | Kowalczyk | |
| 6,489,565 B1 | 12/2002 | Krietzman et al. | |
| 6,501,899 B1 | 12/2002 | Marrs et al. | |
| 6,502,702 B1 | 1/2003 | Hsue et al. | |
| 6,504,100 B2 | 1/2003 | Lawrence et al. | |
| 6,515,225 B1 | 2/2003 | Wright | |
| 6,517,174 B2 | 2/2003 | Sevier | |
| 6,527,351 B1 | 3/2003 | Sevier et al. | |
| 6,535,681 B2 | 3/2003 | Daoud et al. | |
| 6,541,705 B1 | 4/2003 | McGrath | |
| 6,546,179 B2 | 4/2003 | Petri | |
| 6,554,697 B1 | 4/2003 | Koplin | |
| 6,561,602 B1 | 5/2003 | Sevier et al. | |
| 6,565,166 B1 | 5/2003 | Bulk et al. | |
| 6,584,267 B1 | 6/2003 | Caveney et al. | |
| 6,605,782 B1 | 8/2003 | Krietzman et al. | |
| 6,613,981 B1 | 9/2003 | Hathcock et al. | |
| 6,614,978 B1 | 9/2003 | Caveney et al. | |
| 6,632,999 B2 | 10/2003 | Sempliner et al. | |
| 6,695,149 B1 | 2/2004 | Cote et al. | |
| 6,712,434 B2 | 3/2004 | Knab et al. | |
| 6,755,493 B1 | 6/2004 | Krietzman et al. | |
| 6,760,531 B1 | 7/2004 | Solheid et al. | |
| 6,762,360 B2 | 7/2004 | Wright | |
| 6,796,437 B2 | 9/2004 | Krampotich et al. | |
| 6,808,240 B2 | 10/2004 | Altena | |
| 6,814,244 B1 | 11/2004 | Hathcock | |
| 6,883,879 B2 | 4/2005 | Latchinian | |
| 6,884,942 B2 | 4/2005 | McGrath et al. | |
| 6,915,616 B2 | 7/2005 | Fontana et al. | |
| 6,918,796 B2 | 7/2005 | Elliot et al. | |

(56) References Cited

U.S. PATENT DOCUMENTS

| | | |
|---|---|---|
| 6,946,605 B2 | 9/2005 | Levesque et al. |
| 6,951,288 B2 | 10/2005 | Henderson |
| 6,964,588 B2 | 11/2005 | Follingstad et al. |
| 6,968,647 B2 | 11/2005 | Levesque et al. |
| 6,976,292 B2 | 12/2005 | MacPherson et al. |
| 6,981,893 B2 | 1/2006 | Barker et al. |
| 6,992,247 B2 | 1/2006 | Rasmussen et al. |
| 7,000,784 B2 | 2/2006 | Canty et al. |
| 7,019,213 B1 | 3/2006 | McNutt et al. |
| 7,026,553 B2 | 4/2006 | Levesque et al. |
| 7,119,282 B2 | 10/2006 | Krietzman et al. |
| 7,144,320 B2 | 12/2006 | Turek et al. |
| 7,178,292 B2 | 2/2007 | Yamada |
| 7,178,679 B2 | 2/2007 | Canty et al. |
| 7,200,316 B2 | 4/2007 | Giraud et al. |
| 7,220,150 B2 | 5/2007 | Follingstad et al. |
| 7,225,586 B2 | 6/2007 | Levesque et al. |
| 7,226,260 B2 | 6/2007 | Jackson, Jr. et al. |
| 7,255,640 B2 | 8/2007 | Aldag et al. |
| 7,259,326 B2 | 8/2007 | Nguyen |
| 7,285,027 B2 | 10/2007 | McGrath et al. |
| 7,293,666 B2 | 11/2007 | Mattlin et al. |
| 7,316,461 B2 | 1/2008 | Wyatt et al. |
| 7,362,941 B2 | 4/2008 | Rinderer et al. |
| 7,378,046 B2 | 5/2008 | Canty et al. |
| 7,381,100 B2 | 6/2008 | Follingstad et al. |
| 7,417,188 B2 | 8/2008 | McNutt et al. |
| 7,425,678 B2 | 9/2008 | Adducci et al. |
| 7,427,713 B2 | 9/2008 | Adducci et al. |
| 7,438,638 B2 | 10/2008 | Lewis, II et al. |
| 7,458,859 B2 | 12/2008 | McGrath et al. |
| 7,472,970 B2 | 1/2009 | Bergesch et al. |
| 7,476,804 B2 | 1/2009 | Adducci et al. |
| 7,485,803 B2 | 2/2009 | Adducci et al. |
| 7,495,169 B2 | 2/2009 | Adducci et al. |
| 7,498,512 B2 | 3/2009 | Adducci et al. |
| 7,504,581 B2 | 3/2009 | Adducci et al. |
| 7,507,912 B1 | 3/2009 | Sempliner et al. |
| 7,542,287 B2 | 6/2009 | Lewis, II et al. |
| 7,547,228 B1 | 6/2009 | Schlarman |
| 7,592,541 B2 | 9/2009 | Adducci et al. |
| 7,608,779 B2 | 10/2009 | Adducci et al. |
| 7,637,771 B2 | 12/2009 | Laursen |
| 7,667,135 B2 | 2/2010 | Adducci et al. |
| 7,697,285 B2 | 4/2010 | Donowho et al. |
| 7,718,889 B2 | 5/2010 | Rasmussen et al. |
| 7,718,891 B2 | 5/2010 | Adducci et al. |
| 7,746,637 B2 | 6/2010 | Donowho et al. |
| 7,762,405 B2 | 7/2010 | Vogel et al. |
| 7,764,495 B2 | 7/2010 | Hruby et al. |
| 7,772,489 B2 | 8/2010 | Adducci et al. |
| 7,778,513 B2 | 8/2010 | Rinderer et al. |
| 7,781,675 B2 | 8/2010 | Adducci et al. |
| 7,789,606 B2 | 9/2010 | Kosidlo, IV et al. |
| 7,795,532 B2 | 9/2010 | Walker |
| 7,804,685 B2 | 9/2010 | Krietzman |
| 7,823,846 B2 | 11/2010 | Williams, III |
| 7,839,635 B2 | 11/2010 | Donowho et al. |
| 7,880,084 B2 | 2/2011 | Adducci et al. |
| 7,893,356 B2 | 2/2011 | Garza et al. |
| 7,894,190 B2 | 2/2011 | Davis et al. |
| 7,952,869 B2 | 5/2011 | Lewis, II et al. |
| 7,957,139 B2 | 6/2011 | Davis et al. |
| 7,973,242 B2 | 7/2011 | Jones et al. |
| 7,999,183 B2 | 8/2011 | Garza et al. |
| 8,035,965 B2 | 10/2011 | Adducci et al. |
| 8,040,673 B2 | 10/2011 | Krietzman |
| 8,049,109 B2 | 11/2011 | Sempliner et al. |
| 8,107,238 B2 | 1/2012 | Krietzman et al. |
| 8,138,419 B2 | 3/2012 | Garza et al. |
| 8,235,634 B2 | 8/2012 | Larsen et al. |
| 8,237,052 B2 | 8/2012 | Adducci et al. |
| 8,263,867 B2 | 9/2012 | Garza et al. |
| 8,273,989 B2 | 9/2012 | Garza et al. |
| 8,281,940 B2 | 10/2012 | Fan |
| 8,317,274 B2 | 11/2012 | Hsiao |
| 8,330,043 B2 | 12/2012 | Alaniz et al. |
| 8,395,046 B2 | 3/2013 | Nicewicz et al. |
| 8,405,984 B2 | 3/2013 | Donowho et al. |
| 8,424,691 B2 | 4/2013 | McMillan, III et al. |
| 8,443,987 B2 | 5/2013 | Peng et al. |
| 8,459,918 B2 * | 6/2013 | Lin .................. F16B 37/044 411/113 |
| 8,556,357 B2 | 10/2013 | Fan |
| 8,628,158 B2 | 1/2014 | Caveney |
| 8,653,363 B2 | 2/2014 | Behrens et al. |
| 8,683,762 B2 | 4/2014 | Rodriquez et al. |
| 8,730,665 B2 | 5/2014 | Lewis, II et al. |
| 8,737,068 B2 | 5/2014 | Krietzman et al. |
| 8,746,466 B2 | 6/2014 | Taylor |
| 8,787,023 B2 | 7/2014 | Lewis, II et al. |
| 8,844,888 B1 | 9/2014 | Gretz |
| 8,867,206 B2 | 10/2014 | Hruby et al. |
| 8,879,881 B2 | 11/2014 | Cote et al. |
| 8,901,438 B2 | 12/2014 | Lewis, II et al. |
| 8,973,951 B2 | 3/2015 | Nicewicz |
| 9,055,677 B2 | 6/2015 | Garza, Jr. et al. |
| 9,084,369 B2 | 7/2015 | Lewis, II et al. |
| 9,119,329 B2 | 8/2015 | Krietzman et al. |
| 9,210,833 B2 | 12/2015 | Caveney et al. |
| 9,332,863 B2 | 5/2016 | Ramey et al. |
| 9,351,427 B2 | 5/2016 | Lewis, II et al. |
| 9,408,326 B2 | 8/2016 | Lewis, II et al. |
| 9,420,727 B2 | 8/2016 | Lewis, II et al. |
| 9,548,597 B2 | 1/2017 | Vacca et al. |
| 9,549,487 B2 | 1/2017 | Lewis, II et al. |
| 9,572,286 B2 | 2/2017 | Greeson et al. |
| 9,627,860 B2 | 4/2017 | Proserpio et al. |
| 9,642,270 B2 | 5/2017 | Lewis, II et al. |
| 9,781,852 B2 | 10/2017 | Garza, Jr. et al. |
| 9,795,060 B2 | 10/2017 | Greeson et al. |
| 9,801,309 B2 | 10/2017 | Krietzman et al. |
| 9,814,159 B2 | 11/2017 | Lewis, II et al. |
| 9,949,406 B2 | 4/2018 | Lewis, II et al. |
| 9,974,198 B2 | 5/2018 | Lewis, II et al. |
| 9,980,400 B2 | 5/2018 | Lewis, II et al. |
| 10,123,462 B2 | 11/2018 | Krietzman et al. |
| 10,178,784 B2 | 1/2019 | Lewis, II et al. |
| 10,237,994 B2 | 3/2019 | Donowho et al. |
| 10,271,452 B2 | 4/2019 | Hennrich et al. |
| 10,334,761 B2 | 6/2019 | Krietzman et al. |
| 10,337,550 B2 | 7/2019 | Davis et al. |
| 10,356,951 B2 | 7/2019 | Lewis, II et al. |
| 10,440,847 B2 | 10/2019 | Lewis, II et al. |
| 10,477,720 B2 | 11/2019 | Hennrich et al. |
| 10,568,239 B2 | 2/2020 | Krietzman et al. |
| 10,588,227 B2 | 3/2020 | Donowho et al. |
| 10,595,442 B2 | 3/2020 | Davis |
| 10,624,232 B2 | 4/2020 | Krietzman |
| 10,653,025 B2 | 5/2020 | Garza et al. |
| 10,674,634 B2 | 6/2020 | Lewis, II et al. |
| 10,765,037 B2 | 9/2020 | Lewis, II et al. |
| 10,791,640 B2 | 9/2020 | Lewis, II et al. |
| 10,859,111 B2 | 12/2020 | Davis |
| 11,039,543 B2 | 6/2021 | Donowho et al. |
| 11,071,227 B2 | 7/2021 | Hennrich et al. |
| 11,083,108 B2 | 8/2021 | Lewis, II et al. |
| 11,162,615 B2 | 11/2021 | Hennrich et al. |
| 11,209,039 B2 | 12/2021 | Davis et al. |
| 11,212,928 B2 | 12/2021 | Lewis, II et al. |
| 11,268,636 B2 | 3/2022 | Hennrich et al. |
| 11,342,730 B1 | 5/2022 | Thompson et al. |
| 11,464,123 B2 | 10/2022 | Garza, Jr. et al. |
| 11,464,132 B2 | 10/2022 | Krietzman |
| 11,493,151 B2 | 11/2022 | Hennrich et al. |
| 11,547,020 B2 | 1/2023 | Lewis et al. |
| 2002/0046979 A1 | 4/2002 | Larsen et al. |
| 2002/0074149 A1 | 6/2002 | Lawrence et al. |
| 2002/0149911 A1 | 10/2002 | Bishop et al. |
| 2002/0172013 A1 | 11/2002 | Chandler |
| 2003/0020379 A1 | 1/2003 | Larsen et al. |
| 2003/0034717 A1 | 2/2003 | Yao |
| 2003/0079897 A1 | 5/2003 | Sempliner et al. |
| 2003/0226238 A1 | 12/2003 | Baer |

(56) References Cited

U.S. PATENT DOCUMENTS

| | | |
|---|---|---|
| 2004/0016713 A1 | 1/2004 | Wyatt et al. |
| 2004/0020873 A1 | 2/2004 | Henderson |
| 2004/0050808 A1 | 3/2004 | Krampotich et al. |
| 2004/0154818 A1 | 8/2004 | Franks, Jr. |
| 2004/0181916 A1 | 9/2004 | Arduini |
| 2004/0183409 A1 | 9/2004 | Rinderer |
| 2004/0190270 A1 | 9/2004 | Aldag et al. |
| 2004/0201335 A1 | 10/2004 | Davis |
| 2005/0220562 A1* | 10/2005 | Blackaby .............. F16B 37/044 411/111 |
| 2005/0247650 A1 | 11/2005 | Vogel et al. |
| 2006/0103270 A1 | 5/2006 | Bergesch et al. |
| 2006/0141921 A1 | 6/2006 | Turek et al. |
| 2007/0064389 A1 | 3/2007 | Lewis, II et al. |
| 2007/0064391 A1 | 3/2007 | Lewis, II et al. |
| 2007/0210679 A1 | 9/2007 | Adducci et al. |
| 2007/0210680 A1 | 9/2007 | Appino et al. |
| 2007/0210681 A1 | 9/2007 | Adducci et al. |
| 2007/0210683 A1 | 9/2007 | Adducci et al. |
| 2007/0210686 A1 | 9/2007 | Adducci et al. |
| 2007/0221393 A1 | 9/2007 | Adducci et al. |
| 2007/0249237 A1 | 10/2007 | Follingstad et al. |
| 2007/0257159 A1 | 11/2007 | Nelson et al. |
| 2007/0293138 A1 | 12/2007 | Adducci et al. |
| 2008/0035810 A1 | 2/2008 | Lewis, II |
| 2008/0037228 A1 | 2/2008 | Lewis, II |
| 2008/0062654 A1 | 3/2008 | Mattlin et al. |
| 2008/0067904 A1 | 3/2008 | Adducci et al. |
| 2008/0074849 A1 | 3/2008 | Adducci et al. |
| 2008/0130262 A1 | 6/2008 | Rinderer et al. |
| 2008/0141495 A1 | 6/2008 | Fisher |
| 2008/0155915 A1 | 7/2008 | Howe et al. |
| 2008/0174217 A1 | 7/2008 | Walker |
| 2008/0266789 A1 | 10/2008 | Hruby et al. |
| 2008/0289873 A1 | 11/2008 | Herring et al. |
| 2008/0316702 A1 | 12/2008 | Donowho et al. |
| 2008/0316703 A1 | 12/2008 | Donowho et al. |
| 2009/0014614 A1 | 1/2009 | Warmoth et al. |
| 2009/0059523 A1 | 3/2009 | Mallia et al. |
| 2009/0061755 A1 | 3/2009 | Calder et al. |
| 2009/0093169 A1 | 4/2009 | McGrath et al. |
| 2009/0129013 A1 | 5/2009 | Donowho et al. |
| 2009/0151983 A1 | 6/2009 | Sempliner et al. |
| 2009/0165250 A1 | 7/2009 | Duan et al. |
| 2009/0190307 A1 | 7/2009 | Krietzman |
| 2009/0227197 A1 | 9/2009 | Lewis, II et al. |
| 2009/0236117 A1 | 9/2009 | Garza et al. |
| 2009/0239461 A1 | 9/2009 | Lewis, II et al. |
| 2009/0283488 A1 | 11/2009 | McMillan, III et al. |
| 2010/0003911 A1 | 1/2010 | Graczyk et al. |
| 2010/0061059 A1 | 3/2010 | Krietzman et al. |
| 2010/0084188 A1 | 4/2010 | Rajvanshi et al. |
| 2010/0096105 A1 | 4/2010 | Novotny et al. |
| 2010/0096962 A1 | 4/2010 | Rajvanshi et al. |
| 2010/0101820 A1 | 4/2010 | Alaniz et al. |
| 2010/0122830 A1 | 5/2010 | Garza et al. |
| 2010/0126750 A1 | 5/2010 | Garza et al. |
| 2010/0126751 A1 | 5/2010 | Garza et al. |
| 2010/0172092 A1 | 7/2010 | Davis et al. |
| 2010/0172093 A1 | 7/2010 | Davis et al. |
| 2010/0193241 A1 | 8/2010 | Bennett et al. |
| 2010/0193754 A1 | 8/2010 | Garza et al. |
| 2010/0200707 A1 | 8/2010 | Garza et al. |
| 2010/0243315 A1 | 9/2010 | Shumate et al. |
| 2011/0001408 A1 | 1/2011 | Caveney et al. |
| 2011/0019362 A1 | 1/2011 | Krietzman |
| 2011/0020091 A1* | 1/2011 | Larsen ................ F16B 37/044 411/84 |
| 2011/0083873 A1 | 4/2011 | Hartman et al. |
| 2011/0100668 A1 | 5/2011 | Syed |
| 2011/0148261 A1 | 6/2011 | Donowho et al. |
| 2011/0173906 A1 | 7/2011 | Reddicliffe |
| 2011/0278060 A1 | 11/2011 | Rajvanshi et al. |
| 2011/0278999 A1 | 11/2011 | Caveney et al. |
| 2011/0287704 A1 | 11/2011 | Lewis, II et al. |
| 2011/0290553 A1 | 12/2011 | Behrens et al. |
| 2011/0308179 A1 | 12/2011 | Pirner |
| 2012/0012543 A1 | 1/2012 | Fan |
| 2012/0013229 A1 | 1/2012 | Krietzman |
| 2012/0043869 A1 | 2/2012 | Liu et al. |
| 2012/0049706 A1 | 3/2012 | Cottuli et al. |
| 2012/0062083 A1 | 3/2012 | Lewis, II et al. |
| 2012/0062084 A1 | 3/2012 | Lewis, II et al. |
| 2012/0062086 A1 | 3/2012 | Garza, Jr. et al. |
| 2012/0062091 A1 | 3/2012 | Donowho et al. |
| 2012/0063099 A1 | 3/2012 | Maniz et al. |
| 2012/0080984 A1 | 4/2012 | Watts |
| 2012/0110788 A1* | 5/2012 | Chen .................. E04B 2/821 29/428 |
| 2012/0134763 A1* | 5/2012 | Lin .................... F16B 37/044 411/173 |
| 2012/0181906 A1 | 7/2012 | Caveney |
| 2012/0194999 A1 | 8/2012 | Krietzman et al. |
| 2012/0244729 A1 | 9/2012 | Rivera et al. |
| 2012/0267991 A1 | 10/2012 | Adducci et al. |
| 2012/0279779 A1 | 11/2012 | Cottuli et al. |
| 2012/0305307 A1 | 12/2012 | Korcz et al. |
| 2013/0069501 A1 | 3/2013 | Liu |
| 2014/0132134 A1 | 5/2014 | Garza, Jr. et al. |
| 2014/0265774 A1 | 9/2014 | Stewart, Jr. et al. |
| 2014/0319084 A1 | 10/2014 | Lewis, II et al. |
| 2014/0323029 A1 | 10/2014 | Lewis, II et al. |
| 2014/0334099 A1 | 11/2014 | Krietzman et al. |
| 2015/0008810 A1 | 1/2015 | Ivey et al. |
| 2015/0030300 A1 | 1/2015 | Terry et al. |
| 2015/0065028 A1 | 3/2015 | Krietzman |
| 2015/0069888 A1 | 3/2015 | Lewis, II et al. |
| 2015/0136714 A1 | 5/2015 | Franklin |
| 2015/0173253 A1 | 6/2015 | Lewis, II et al. |
| 2015/0250071 A1 | 9/2015 | Garza, Jr. et al. |
| 2015/0264839 A1 | 9/2015 | Lewis, II et al. |
| 2015/0282390 A1 | 10/2015 | Lewis, II et al. |
| 2015/0319872 A1 | 11/2015 | Lewis, II et al. |
| 2015/0333303 A1 | 11/2015 | Hachiya et al. |
| 2015/0342082 A1 | 11/2015 | Roehrl et al. |
| 2015/0351289 A1 | 12/2015 | Krietzman et al. |
| 2015/0366094 A1 | 12/2015 | Segroves et al. |
| 2016/0138261 A1* | 5/2016 | Zhang ................ F16B 37/045 29/897.3 |
| 2016/0262277 A1 | 9/2016 | Lewis, II et al. |
| 2016/0302317 A1 | 10/2016 | Lewis, II et al. |
| 2017/0127569 A1 | 5/2017 | Rimler et al. |
| 2017/0127570 A1 | 5/2017 | Lewis, II et al. |
| 2017/0150652 A1 | 5/2017 | Greeson et al. |
| 2017/0167523 A1 | 6/2017 | Davis et al. |
| 2017/0223864 A1 | 8/2017 | Jost et al. |
| 2017/0223865 A1 | 8/2017 | Lewis, II et al. |
| 2017/0290181 A1 | 10/2017 | Donowho et al. |
| 2017/0331269 A1 | 11/2017 | Hansen |
| 2017/0332501 A1 | 11/2017 | Lewis, II et al. |
| 2018/0027677 A1 | 1/2018 | Garza, Jr. et al. |
| 2018/0042143 A1 | 2/2018 | Krietzman et al. |
| 2018/0110153 A1 | 4/2018 | Hennrich et al. |
| 2018/0228056 A1 | 8/2018 | Lewis, II et al. |
| 2018/0263127 A1 | 9/2018 | Lewis, II et al. |
| 2018/0270968 A1 | 9/2018 | Lewis, II et al. |
| 2019/0063483 A1 | 2/2019 | Davis |
| 2019/0098791 A1 | 3/2019 | Hennrich et al. |
| 2019/0098792 A1 | 3/2019 | Hennrich et al. |
| 2019/0215973 A1 | 7/2019 | Donowho et al. |
| 2019/0313551 A1 | 10/2019 | Krietzman et al. |
| 2019/0343023 A1 | 11/2019 | Lewis, II et al. |
| 2020/0039033 A1* | 2/2020 | Lai ...................... B25B 5/16 |
| 2020/0077534 A1 | 3/2020 | Hennrich et al. |
| 2020/0113074 A1 | 4/2020 | Lewis, II et al. |
| 2020/0187387 A1 | 6/2020 | Lewis, II et al. |
| 2020/0196465 A1 | 6/2020 | Donowho et al. |
| 2020/0245494 A1 | 7/2020 | Krietzman |
| 2020/0275569 A1 | 8/2020 | Garza, Jr. et al. |
| 2020/0288605 A1 | 9/2020 | Lewis, II et al. |
| 2020/0367381 A1 | 11/2020 | Hennrich et al. |
| 2020/0367382 A1 | 11/2020 | Hennrich et al. |
| 2020/0383230 A1 | 12/2020 | Hennrich et al. |
| 2020/0396868 A1 | 12/2020 | Lewis, II et al. |

(56) References Cited

U.S. PATENT DOCUMENTS

| | | |
|---|---|---|
| 2021/0014988 A1 | 1/2021 | Lewis, II et al. |
| 2021/0079944 A1 | 3/2021 | Davis |
| 2021/0307183 A1 | 9/2021 | Donowho et al. |
| 2021/0329808 A1 | 10/2021 | Hennrich et al. |
| 2021/0385976 A1 | 12/2021 | Lewis, II et al. |
| 2022/0034430 A1 | 2/2022 | Hennrich et al. |
| 2022/0099133 A1 | 3/2022 | Davis |
| 2022/0124924 A1 | 4/2022 | Lewis, II et al. |
| 2022/0183190 A1 | 6/2022 | Lewis, II et al. |
| 2022/0235883 A1 | 7/2022 | Hennrich et al. |
| 2023/0013890 A1 | 1/2023 | Garza, Jr. et al. |
| 2023/0014492 A1 | 1/2023 | Krietzman |

FOREIGN PATENT DOCUMENTS

| | | |
|---|---|---|
| CN | ZL201680073061.8 | 5/2021 |
| DE | 20207426 U1 | 9/2002 |
| EP | 2205054 A1 | 7/2010 |
| EP | 2429271 | 3/2012 |
| EP | 2429272 | 3/2012 |
| FR | 1402979 A | 6/1965 |
| FR | 2794501 A1 | 12/2000 |
| GB | 981072 A | 1/1965 |
| GB | 2366084 B | 9/2002 |
| JP | H8-8-187537 | 7/1996 |
| JP | 2019-502069 | 1/2019 |
| JP | 7066618 | 5/2022 |
| SE | 535066 C2 | 4/2012 |
| WO | 1999048305 | 9/1999 |
| WO | 2001001533 A1 | 1/2001 |
| WO | 2001001534 A1 | 1/2001 |
| WO | 2005112477 A1 | 11/2005 |
| WO | 2006055506 A2 | 5/2006 |
| WO | 2008022058 A2 | 2/2008 |
| WO | 2008022058 A3 | 11/2008 |
| WO | 2009089306 A1 | 7/2009 |
| WO | 2009103090 A2 | 8/2009 |
| WO | 2009103090 A3 | 10/2009 |
| WO | 2010028384 A2 | 3/2010 |
| WO | 2010028384 A3 | 5/2010 |
| WO | 2009089306 A4 | 6/2011 |
| WO | 2017105840 A1 | 6/2017 |
| WO | 2018022721 A1 | 2/2018 |

OTHER PUBLICATIONS

Information Disclosure Statement (IDS) Letter Regarding Common Patent Application(s), dated May 27, 2022.

Chatsworth Products, Inc., "Thermal Management Solutions," Signature Solutions Brochure, available at Internet Web Page <www.chatsworth.com/passivecooling>, dated Mar. 2008 (6 pages).

"European Search Report" European Patent Application No. 11275109.4 for Chatsworth Products Inc., dated Sep. 18, 2014 (5 pages).

Rack Technologies Pty Ltd, Product Catalog, Internet Web Page <http://racktechnologies.com.au/files/rt2005.pdf>, Jun. 16, 2005, retrieved from Internet Archive Wayback Machine <http://web.archive.org/web/20050616212856/http://racktechnologies.com.au/files/rt2005.pdf> as reviewed as of Apr. 29, 2016 (73 pages).

Emerson Network Power, Smart Cooling Solutions Data Center, Oct. 2012, Internet Web Page <http://www.emersonnetworkpower.com/en-EMEA/Products/RACKSANDINTEGRATEDCABINETS/Documents/Knurr%20DCD/Smart-Cooling-Solutions-Data-Center-EN.pdf> (51 pages).

Eaton Corporation, Eaton Airflow Management Solutions: Installation Guide for Telescopic Chimney for SSeries Enclosures, Publication No. MN160007EN, dated 2014 (13 pages).

Eaton Corporation, Data Center Products: Eaton Telescopic Chimney, dated 2014 (2 pages).

Hewlett-Packard Development Company, LP, HP 10000 G2 42U Rack Air Duct Installation Guide, dated Aug. 2008 (23 pages).

Panduit Corporation, Panduit Net-Access Vertical Exhaust Duct (VED) Instructions, dated 2009 (4 pages).

Panduit Corporation, Panduit Net-Access Vertical Exhaust System (VES) Specification Sheet, dated 2011 (4 pages).

Panduit Corporation, Panduit Vertical Exhaust Duct for N-Type and S-Type Cabinets: Installation Instructions, dated 2012 (14 pages).

Information Disclosure Statement (IDS) Letter Regarding Common Patent Application(s), dated Dec. 12, 2022.

Information Disclosure Statement (IDS) Letter Regarding Common Patent Application(s), dated Jan. 28, 2023.

\* cited by examiner

US 11,678,458 B1

SLIDABLE MOUNTING HARDWARE FOR ELECTRONIC EQUIPMENT ENCLOSURE AND METHOD FOR INSTALLING SAME

CROSS-REFERENCE TO RELATED APPLICATIONS

The present application is a U.S. continuation patent application of, and claims priority under 35 U.S.C. § 120 to, U.S. nonprovisional patent application Ser. No. 17/550,976, filed Dec. 14, 2021, which '976 application, any application publication thereof, and any patent issuing therefrom are each expressly incorporated herein by reference in their entirety, and which '976 application is a U.S. nonprovisional patent application of, and claims priority under 35 U.S.C. § 119(e) to, U.S. provisional patent application Ser. No. 63/125,489, filed Dec. 15, 2020, which '489 application is incorporated by reference herein in its entirety. Additionally, the entirety of each of the following commonly-assigned U.S. provisional patent applications is incorporated herein by reference:

(a) U.S. provisional patent application Ser. No. 63/125,499, filed Dec. 15, 2020 and entitled, "CASTER ATTACHMENT SYSTEM USING MATING FEATURES," attached hereto as Appendix A;

(b) U.S. provisional patent application Ser. No. 63/125,504, filed Dec. 15, 2020 and entitled, "BRUSH PORT ASSEMBLY," attached hereto as Appendix B;

(c) U.S. provisional patent application Ser. No. 63/125,506, filed Dec. 15, 2020 and entitled, "FRAME STRUCTURE FOR ELECTRONIC EQUIPMENT ENCLOSURE," attached hereto as Appendix C; and The disclosure of each of the foregoing U.S. provisional patent applications is contained in the corresponding appendix, as designated above, each of which is likewise incorporated herein in its entirety by reference and is intended to provide background and technical information with regard to the systems and environments of the inventions of the current nonprovisional patent application.

COPYRIGHT STATEMENT

All of the material in this patent document is subject to copyright protection under the copyright laws of the United States and other countries. The copyright owner has no objection to the facsimile reproduction by anyone of the patent document or the patent disclosure, as it appears in official governmental records but, otherwise, all other copyright rights whatsoever are reserved.

BACKGROUND OF THE PRESENT INVENTION

Field of the Present Invention

The present invention relates generally to mounting hardware for electronic equipment enclosures, and, in particular, to slidable mounting hardware receivable in slots or channels of slide-type mounting rails.

Background

Electronic equipment enclosures, such as frames, cabinets, and the like for supporting computer and other electronic equipment, are very well known. Many electronic equipment enclosures employ slots or channels in structural components to facilitate attachment of other components, such as equipment mounting rails or cable management accessories. Various known hardware configurations for mounting equipment rails and/or accessories are described below.

FIG. 1 is a fragmentary isometric view of a prior art slide-type mounting rail 10 with a square head bolt 12 mounted therein. The slide-type mounting rail 10 features an extruded construction with at least one T-slot channel 14 extending along its length. As shown in FIG. 1, the T-slot channel 14 is configured to accommodate a bolt 12 having a square head 16. The square head 16 of the bolt 12 is received at an end of the T-slot channel prior to installation of the rail in an enclosure. Unfortunately, square head bolts 12 can easily become snagged within the channel 14 and, thus, often do not slide freely to permit adjustment of the bolt position. Moreover, owing to its square head shape, a square head bolt 12 can only be added or removed when ends of the channel 14 are unobstructed, which is rarely the case when the rail 10 is installed in an enclosure. Still further, conventional square head bolt designs do not facilitate electrical bonding between the bolt 12 and the channel 14, which is usually painted or coated.

Various specialized mounting hardware has been developed to address some of these issues. For example, FIG. 2A is a fragmentary isometric view of the slide-type mounting rail 10 of FIG. 1 and a drop-in spring nut 22, and FIG. 2B is a fragmentary isometric view of the slide-type mounting rail 10 of FIG. 2A with the drop-in spring nut 22 mounted therein. The drop-in spring nut 22 of FIGS. 2A and 2B features a narrow width and one or more spring arms 24 that are capable of deflection but will return to an undeflected state once an applied force is removed. As shown in FIGS. 2A and 2B, the spring arms 24 of the drop-in spring nut 22 are compressible to permit the nut 22 to be received within the T-slot channel 14 of the mounting rail 10 at a desired position along the channel 14. Once the drop-in spring nut 22 is within the channel 14, the spring arm(s) spring back, which forces the face of the nut 22 against the channel opening for receipt of a bolt or other fastener. Unfortunately, due to the spring force of the spring arms 24, drop-in spring nuts 22 still cannot be maneuvered freely within the channel 14, thus making it difficult to adjust the position of the nut 22 post-installation. Additionally, drop-in spring nuts 22 do not electrically bond with the painted or coated surfaces of most equipment rails. Still further, because installed drop-in spring nuts 22 are fully received within the channel 14, it can be quite difficult for a user to connect bolt-mounted equipment and accessories absent a direct view of where the nut 22 is positioned within the channel 14.

FIG. 3 is a fragmentary end view of a prior art slide-type mounting strut 30 with a channel nut 32 and retaining spring 40 mounted therein. Mounting struts 30 with spring-biased channel nuts 32 offer another configuration for mounting equipment rails and/or accessories. One conventional strut/channel nut combination is sold under the UNISTRUT® brand by Atkore International of Harvey, Ill. The mounting strut 30 defines a lengthwise channel 34 with opposed channel ledges 38 extending inward from either side. The face of the channel nut 32 includes grooves 36 that correspond to the ledges 38 of the channel 34. The retaining spring 40 is centered at the rear face of the channel nut 32 and is designed to retain the nut in position within the channel 34. During installation of the channel nut 32, the retaining spring 40 is compressed so that the ledges 38 no longer bear on the front face of the nut 32, thereby permitting the nut to be maneuvered through the channel 34. Once released, the spring 40, still in a partially biased state, pushes against the rear wall of the channel 34, which presses the grooves 36 of the channel nut 32 against the ledges 38 of the strut. In this manner, the channel nut 32 is retained in position within the channel 34. Unfortunately, as with drop-in spring nuts, the channel nut 32 is largely hidden within the channel 34 of the strut 30, thus adding difficulty to the attachment of bolt-mounted equipment and accessories absent a direct view of the nut 32. Moreover, owing to the retaining spring 40 being in a partially biased state, the channel nut 32 is not capable of sliding freely within the channel 34 after installation.

FIG. 4 is a fragmentary perspective view of another prior art slide-type mounting strut 46 with a hammer head bolt 48 mounted therein, and FIG. 5 is a perspective view of the hammer head bolt 48 of FIG. 4. This mounting strut 46 has an extruded construction with four T-slot channels 52, each opening at a different side of the strut 46 and extending the length thereof. The hammer head bolt 48 includes a T-shaped head 54 and a threaded shaft 56. The T-shaped head 54 has a rectangular shape with a pair of short ends and a pair of long ends. Beneath the long ends that overhang the threaded shaft 56 are groups of paint-cutting ribs 58 that are designed to cut through a painted or coated surface when the bolt is tightened. Additionally, at one of the short ends, the T-shaped head 54 includes an anti-rotation shoulder 60 to prevent the bolt 48 from rotating more than ninety degrees within the T-slot channel 52.

With reference to FIGS. 4 and 5, the hammer head bolt 48 can be inserted into one of the T-slot channels 52 from an end thereof, with the long ends of the head 54 in alignment with the channel. Alternatively, the width of the head 54 is sufficiently narrow as to permit the head to be inserted directly into the T-slot channel 52 from any location along its length. In this latter regard, the hammer head bolt 48 can be installed after the mounting strut 46 is already installed in a cabinet frame assembly. Once received within the T-slot channel 52, the hammer head bolt 48 is rotated ninety degrees in a clockwise direction to secure the bolt. In so doing, the long edges of the head 54 overhang the ledges of the T-slot channel 52 to prevent the bolt from removal, the paint-cutting ribs 58 of the head 54 cut through the paint or coating on adjacent strut surfaces to establish a metal-on-metal connection, and the anti-rotation shoulder 60 prevents the bolt from over-rotation within the channel 52. Unfortunately, even with the anti-rotation shoulder 60 to prevent over-rotation in the clockwise direction, there is nothing to prevent the hammer head bolt 48 from becoming loose by rotating in the counterclockwise direction, in which case the bolt 48 may unintentionally loosen or become uninstalled. Moreover, once the hammer head bolt 48 is installed, there is no indicator to confirm to an installer that the bolt 48 is properly positioned within the channel 52.

Another approach utilizes specialized mounting rails that do not include continuous channels for bolts. For example, FIG. 6 is a fragmentary isometric view of a prior art slot-type mounting rail 62 with a carriage bolt 64 mounted therein. The slot-type mounting rail 62 is constructed of steel tubing or formed sheet metal and includes a series of slots or openings 66 therethrough. Each slot 66 includes a large central portion shaped and sized to permit the round head 68 of a conventional carriage bolt 64 to be inserted therethrough. To each side of the central portion, the slot 66 becomes narrower such that, when the carriage bolt 66 is maneuvered within the slot 66 in either direction from the central portion, the round head 68 prevents the bolt from being removed. Unfortunately, with a slot-type mounting rail 62, there are limitations with respect to where the bolt can be positioned along the length of the rail. In particular, the bolt 64 is only permitted to be positioned within one of the slots 66, and then only at a location within the slot 66 where the bolt 64 cannot inadvertently be removed therefrom (i.e., not at the large central portion). Furthermore, because there are multiple slots 66 in lieu of one long continuous slot, moving the carriage bolt 64 may require removing hardware entirely so that the bolt 66 can be removed from one slot 66 and relocated to a different slot 66. In addition to these shortcomings, carriage bolts 64 generally do not electrically bond with painted or coated surfaces of most equipment rails. Still further, carriage bolts 64 sometimes have a tendency during installation to fall entirely through a slot 66 to the other side, as there is usually no other structure behind the bolt head 68 to provide a backstop during installation.

As such, a need exists for slidable mounting hardware for electronic equipment enclosures and cabinets that overcome deficiencies of existing hardware solutions. This and other needs are addressed by one or more aspects of the present invention.

SUMMARY OF THE PRESENT INVENTION

Some exemplary embodiments of the present invention may overcome one or more of the above disadvantages and other disadvantages not described above, but the present invention is not required to overcome any particular disadvantage described above, and some exemplary embodiments of the present invention may not overcome any of the disadvantages described above.

The present invention includes many aspects and features. Moreover, while many aspects and features relate to, and are described in, the context of slidable mounting hardware receivable in slots or channels of slide-type mounting rails, the present invention is not limited to use only in slidable mounting hardware receivable in slots or channels of slide-type mounting rails, as will become apparent from the following summaries and detailed descriptions of aspects, features, and one or more embodiments of the present invention.

Broadly defined, the present invention according to one aspect relates to a hardware assembly for installation in a slide-type mounting rail of an electronic equipment enclosure. The hardware assembly includes a spring retainer and a hardware component. The spring retainer has a rear wall and a spring arm extending in a forward direction from each end of the rear wall. Each spring arm includes a distal end that extends inward toward the distal end of the other spring arm and is deflectable. The hardware component is received at least partially within the spring retainer and includes a generally oblong head and a plurality of cam bosses arranged at a front-facing side thereof. Each spring arm engages and is partially deflected by a respective one of the cam bosses, thereby clamping the hardware component within the spring retainer. Upon receipt of the hardware component within a T-slot channel of the slide-type mounting rail, the head is rotatable relative to the spring retainer to position the generally oblong head transversely within the T-slot channel, thereby obstructing the hardware component and the spring retainer from inadvertent removal.

In a feature of this aspect, the head includes a plurality of cutting ribs on the front-facing side thereof for cutting through a painted surface at the interior of the mounting rail to establish metal-on-metal contact between the hardware component and the mounting rail.

In another feature of this aspect, the spring retainer includes a tab stop extending in a forward direction at each side of the rear wall for preventing over-rotation of the hardware component.

In another feature of this aspect, each spring arm includes a locking cam at the distal end thereof for positioning the hardware component relative to the spring retainer.

In another feature of this aspect, the hardware component includes a pivot recess at a rear-facing side thereof that interfaces with a pivot boss arranged on the rear wall of the spring retainer to position the hardware component relative to the spring retainer.

In another feature of this aspect, the hardware component is a bolt having a shaft that protrudes from the front-facing side of the head. In another feature of this aspect, the shaft includes a groove along an end surface thereof for indicating whether the bolt has been rotated.

In another feature of this aspect, the hardware component is a nut having an aperture extending therethrough. In another feature of this aspect, the nut includes a plurality of notches to accommodate a tool for rotating the nut relative to the spring retainer.

Broadly defined, the present invention according to another aspect relates to a method of installing a hardware assembly in a slide-type mounting rail of an electronic equipment enclosure. The method includes: providing a hardware assembly having a spring retainer and a hardware component received at least partially within the spring retainer, wherein the spring retainer includes a rear wall and a deflectable spring arm extending in a forward direction from each end of the rear wall, each spring arm including a distal end that extends inward toward the distal end of the other spring arm, the hardware component includes a generally oblong head and a plurality of cam bosses arranged at a front-facing side thereof, and each spring arm engages and is partially deflected by a respective one of the cam bosses, thereby clamping the hardware component within the spring retainer; positioning the hardware assembly within a T-slot channel of a mounting rail such that bent edges of the deflectable spring arms engage ledges of the T-slot channel to prevent the spring retainer from rotation; and configuring the hardware component from an unlocked position to a locked position by rotating the hardware component a quarter turn relative to the spring retainer to position the generally oblong head transversely within the channel, thereby obstructing the hardware assembly from inadvertent removal from the mounting rail.

In a feature of this aspect, the method further includes sliding the hardware assembly within the T-slot channel to adjust a position thereof.

In another feature of this aspect, rotation of the hardware component relative to the spring retainer causes the spring arms to be deflected outward until the quarter turn is complete, at which point the spring arms snap back against different ones of the plurality of cam bosses.

In another feature of this aspect, each spring arm includes a locking cam at the distal end thereof to prevent the hardware component from rotating back to the unlocked position.

In another feature of this aspect, the spring retainer includes a tab stop extending in a forward direction at each side of the rear wall for preventing over-rotation of the hardware component.

In another feature of this aspect, the hardware component includes a pivot recess at a rear-facing side thereof that interfaces with a pivot boss arranged on the rear wall of the spring retainer to position the hardware component relative to the spring retainer.

In another feature of this aspect, the hardware component is a bolt having a shaft that protrudes from the front-facing side of the head. In another feature of this aspect, the bolt includes a plurality of cutting ribs on the front-facing side thereof, and wherein tightening a nut on the bolt shaft causes the cutting ribs to engage and cut through a painted inner surface of the T-slot channel, thereby establishing metal-on-metal contact between the bolt and the mounting rail. In another feature of this aspect, the shaft includes a groove along an end surface thereof for indicating whether the bolt has been rotated. In another feature of this aspect, the method further includes mounting a structure on the bolt. In another feature of this aspect, when the mounting rail is oriented horizontally, a lower edge of the bolt engages the mounting rail such that the mounting rail provides load-bearing support to a structure mounted with the bolt.

In another feature of this aspect, the hardware component is a nut having an aperture extending therethrough. In another feature of this aspect, the nut includes a plurality of cutting ribs on the front-facing side thereof, and wherein tightening a bolt onto the nut causes the cutting ribs to engage and cut through a painted inner surface of the T-slot channel, thereby establishing metal-on-metal contact between the nut and the mounting rail. In another feature of this aspect, the nut includes a plurality of notches to accommodate a tool for rotating the nut relative to the spring retainer.

Broadly defined, the present invention according to another aspect relates to a hardware assembly for installation in a slide-type mounting rail of an electronic equipment enclosure substantially as shown and described.

Broadly defined, the present invention according to another aspect relates to a bolt and spring retainer for installation in a slide-type mounting rail of an electronic equipment enclosure substantially as shown and described.

Broadly defined, the present invention according to another aspect relates to a nut and spring retainer for installation in a slide-type mounting rail of an electronic equipment enclosure substantially as shown and described.

Broadly defined, the present invention according to another aspect relates to a method of installing a hardware assembly in a slide-type mounting rail of an electronic equipment enclosure substantially as shown and described.

In a feature of this aspect, the hardware assembly includes a bolt and a spring retainer.

In another feature of this aspect, the hardware assembly includes a nut and a spring retainer.

Broadly defined, the present invention according to another aspect relates to a hardware assembly for installation in a slide-type mounting rail of an electronic equipment enclosure. The hardware assembly includes a spring retainer and a hardware component received at least partially within the spring retainer. The spring retainer has a rear wall and a deflectable spring arm extending in a forward direction from each end of the rear wall. Each spring arm includes a distal end that extends inward toward the distal end of the other spring arm. The hardware component includes a generally oblong head and a plurality of cam bosses arranged at a front-facing side thereof. Each spring arm engages and is partially deflected outward by a respective one of the cam bosses, thereby clamping the hardware component within the spring retainer. Upon receipt of the hardware component within a T-slot channel of the slide-type mounting rail, the generally oblong head is rotatable relative to the spring retainer to position the generally oblong head transversely within the T-slot channel, thereby obstructing the hardware component and the spring retainer from inadvertent removal.

In a feature of this aspect, the head includes a plurality of cutting ribs on the front-facing side thereof for cutting through a painted surface at the interior of the slide-type mounting rail to establish metal-on-metal contact between the hardware component and the slide-type mounting rail.

In another feature of this aspect, the spring retainer includes a tab stop extending in a forward direction at each side of the rear wall for preventing over-rotation of the hardware component.

In another feature of this aspect, each spring arm includes a locking cam at the distal end thereof for positioning the hardware component relative to the spring retainer.

In another feature of this aspect, the hardware component includes a pivot recess at a rear-facing side thereof that interfaces with a pivot boss arranged on the rear wall of the spring retainer to maintain alignment of the hardware component relative to the spring retainer during rotation. In another feature of this aspect, the pivot boss is formed at least in part from a countersunk aperture that penetrates the rear wall.

In another feature of this aspect, the distal end of each spring arm includes a concavely curved outer edge that engages the respective one of the cam bosses.

In another feature of this aspect, the hardware component is a bolt having a shaft that protrudes from the front-facing side of the head. In another feature of this aspect, the shaft includes a groove along an end surface thereof for indicating whether the bolt has been rotated.

In another feature of this aspect, the hardware component is a nut having an aperture extending therethrough for receiving a shaft of a bolt. In another feature of this aspect, the nut includes a plurality of aligned notches to accommodate a tool for rotating the nut relative to the spring retainer.

Broadly defined, the present invention according to another aspect relates to a method of installing a hardware assembly in a slide-type mounting rail of an electronic equipment enclosure. The method includes: providing a hardware assembly having a spring retainer and a hardware component received at least partially within the spring retainer, wherein, the spring retainer includes a rear wall and a deflectable spring arm extending in a forward direction from each end of the rear wall, each spring arm including a distal end that extends inward toward the distal end of the other spring arm, the hardware component includes a generally oblong head and a plurality of cam bosses arranged at a front-facing side thereof, and each spring arm engages and is partially deflected by a respective one of the cam bosses, thereby clamping the hardware component within the spring retainer; positioning the hardware assembly within a T-slot channel of the slide-type mounting rail such that bent edges of the deflectable spring arms engage ledges of the T-slot channel to prevent the spring retainer from rotation; and configuring the hardware component from an unlocked position to a locked position by rotating the hardware component a quarter turn relative to the spring retainer to position the generally oblong head transversely within the channel, thereby obstructing the hardware assembly from inadvertent removal from the slide-type mounting rail.

In a feature of this aspect, the method further includes sliding the hardware assembly within the T-slot channel to adjust a position thereof.

In another feature of this aspect, rotation of the hardware component relative to the spring retainer causes the spring arms to be deflected outward until the quarter turn is complete, at which point the spring arms snap back against different respective ones of the plurality of cam bosses.

In another feature of this aspect, each spring arm includes a locking cam at the distal end thereof to prevent the hardware component from rotating back to the unlocked position.

In another feature of this aspect, the distal end of each spring arm includes a concavely curved outer edge that engages the respective one of the cam bosses.

In another feature of this aspect, the spring retainer includes a tab stop extending in a forward direction at each side of the rear wall for preventing over-rotation of the hardware component.

In another feature of this aspect, the hardware component includes a pivot recess at a rear-facing side thereof that interfaces with a pivot boss arranged on the rear wall of the spring retainer to position the hardware component relative to the spring retainer. In another feature of this aspect, the pivot boss is formed at least in part from a countersunk aperture that penetrates the rear wall.

In another feature of this aspect, the hardware component is a bolt having a shaft that protrudes from the front-facing side of the head.

In another feature of this aspect, the bolt includes a plurality of cutting ribs on the front-facing side thereof, and wherein tightening a nut on the bolt shaft causes the cutting ribs to engage and cut through a painted inner surface of the T-slot channel, thereby establishing metal-on-metal contact between the bolt and the slide-type mounting rail to facilitate electrical bonding.

In another feature of this aspect, the shaft includes a groove along an end surface thereof for indicating whether the bolt has been rotated.

In another feature of this aspect, the method further includes mounting a structure on the bolt.

In another feature of this aspect, when the slide-type mounting rail is oriented horizontally, a lower edge of the bolt engages the slide-type mounting rail such that the slide-type mounting rail provides load-bearing support to a structure mounted with the bolt.

In another feature of this aspect, the hardware component is a nut having an aperture extending therethrough.

In another feature of this aspect, the nut includes a plurality of cutting ribs on the front-facing side thereof, and wherein tightening a bolt onto the nut causes the cutting ribs to engage and cut through a painted inner surface of the T-slot channel, thereby establishing metal-on-metal contact between the nut and the slide-type mounting rail to facilitate electrical bonding.

In another feature of this aspect, the nut includes a plurality of notches to accommodate a tool for rotating the nut relative to the spring retainer.

Broadly defined, the present invention according to another aspect relates to a method of securing a structure against a slide-type mounting rail of an electronic equipment enclosure. The method includes: providing a hardware assembly having a spring retainer and a bolt, a head of which is received at least partially within the spring retainer, wherein, the spring retainer includes a rear wall and a deflectable spring arm extending in a forward direction from each end of the rear wall, each spring arm including a distal end that extends inward toward the distal end of the other spring arm, the head of the bolt is generally oblong and includes a plurality of cam bosses arranged at a front-facing side thereof, each spring arm engages and is partially deflected by a respective one of the cam bosses, thereby clamping the head of the bolt within the spring retainer, and a shaft of the bolt protrudes in a forward direction from the spring retainer between the spring arms; positioning the hardware assembly within a T-slot channel of the slide-type mounting rail such that bent edges of the deflectable spring arms engage ledges of the T-slot channel to prevent the spring retainer from rotation; configuring the bolt from an unlocked position to a locked position by rotating the bolt a quarter turn relative to the spring retainer to position the head transversely within the channel, thereby obstructing the hardware assembly from inadvertent removal from the slide-type mounting rail; placing the structure against the slide-type mounting rail such that the shaft extends through an aperture of the structure; and tightening a nut onto the shaft such that the nut is pressed firmly against the structure.

In a feature of this aspect, the method further includes sliding the hardware assembly within the T-slot channel to adjust a position thereof.

In another feature of this aspect, rotation of the bolt relative to the spring retainer causes the spring arms to be deflected outward until the quarter turn is complete, at which point the spring arms snap back against different respective ones of the plurality of cam bosses.

In another feature of this aspect, each spring arm includes a locking cam at the distal end thereof to prevent the bolt from rotating back to the unlocked position.

In another feature of this aspect, the distal end of each spring arm includes a concavely curved outer edge that engages the respective one of the cam bosses.

In another feature of this aspect, the spring retainer includes a tab stop extending in a forward direction at each side of the rear wall for preventing over-rotation of the bolt.

In another feature of this aspect, the bolt includes a pivot recess at a rear-facing side thereof that interfaces with a pivot boss arranged on the rear wall of the spring retainer to position the bolt relative to the spring retainer. In another feature of this aspect, the pivot boss is formed at least in part from a countersunk aperture that penetrates the rear wall.

In another feature of this aspect, the bolt includes a plurality of cutting ribs on the front-facing side thereof. In another feature of this aspect, tightening the nut on the shaft causes the cutting ribs to engage and cut through a painted inner surface of the T-slot channel, thereby establishing metal-on-metal contact between the bolt and the slide-type mounting rail to facilitate electrical bonding. In another feature of this aspect, an electrical bonding path includes each of the slide-type mounting rail, the bolt, the nut, and the structure.

In another feature of this aspect, the shaft includes a groove along an end surface thereof for indicating whether the bolt has been rotated.

In another feature of this aspect, when the slide-type mounting rail is oriented horizontally, a lower edge of the bolt engages the slide-type mounting rail such that the slide-type mounting rail provides load-bearing support to the structure.

Broadly defined, the present invention according to another aspect relates to a method of securing a structure against a slide-type mounting rail of an electronic equipment enclosure. The method includes: providing a hardware assembly having a spring retainer and a nut received at least partially within the spring retainer, wherein, the spring retainer includes a rear wall and a deflectable spring arm extending in a forward direction from each end of the rear wall, each spring arm including a distal end that extends inward toward the distal end of the other spring arm, the nut is generally oblong, has an aperture extending therethrough, and includes a plurality of cam bosses arranged at a front-facing side thereof, and each spring arm engages and is partially deflected by a respective one of the cam bosses, thereby clamping the nut at least partially within the spring retainer; positioning the hardware assembly within a T-slot channel of the slide-type mounting rail such that bent edges of the deflectable spring arms engage ledges of the T-slot channel to prevent the spring retainer from rotation; configuring the nut from an unlocked position to a locked position by rotating the nut a quarter turn relative to the spring retainer, thereby positioning the nut transversely within the channel and obstructing the hardware assembly from inadvertent removal from the slide-type mounting rail; positioning a shaft of a bolt through an aperture of the structure and through the aperture of the nut; and tightening the bolt relative to the nut to bring the front-facing side of the nut into engagement with the T-slot channel.

In a feature of this aspect, the method further includes sliding the hardware assembly within the T-slot channel to adjust a position thereof.

In another feature of this aspect, rotation of the nut relative to the spring retainer causes the spring arms to be deflected outward until the quarter turn is complete, at which point the spring arms snap back against different respective ones of the plurality of cam bosses.

In another feature of this aspect, each spring arm includes a locking cam at the distal end thereof to prevent the nut from rotating back to the unlocked position.

In another feature of this aspect, the distal end of each spring arm includes a concavely curved outer edge that engages the respective one of the cam bosses.

In another feature of this aspect, the spring retainer includes a tab stop extending in a forward direction at each side of the rear wall for preventing over-rotation of the nut.

In another feature of this aspect, the nut includes a pivot recess at a rear-facing side thereof that interfaces with a pivot boss arranged on the rear wall of the spring retainer to position the nut relative to the spring retainer. In another feature of this aspect, the pivot boss is formed at least in part from a countersunk aperture that penetrates the rear wall.

In another feature of this aspect, the nut includes a plurality of cutting ribs on the front-facing side thereof. In another feature of this aspect, tightening the bolt relative to the nut to bring the front-facing side of the nut into engagement with the T-slot channel causes the cutting ribs to engage and cut through a painted inner surface of the T-slot channel, thereby establishing metal-on-metal contact between the nut and the slide-type mounting rail to facilitate electrical bonding. In another feature of this aspect, an electrical bonding path includes each of the slide-type mounting rail, the nut, the bolt, and the structure.

In another feature of this aspect, the nut includes a plurality of notches to accommodate a tool for rotating the nut relative to the spring retainer.

Further areas of applicability of the present invention will become apparent from the detailed description provided hereinafter. It should be understood that the detailed description and specific examples, while indicating preferred embodiment(s) of the invention, are intended for purposes of illustration only and are not intended to limit the scope of the invention.

BRIEF DESCRIPTION OF THE DRAWINGS

Further features, embodiments, and advantages of the present invention will become apparent from the following detailed description with reference to the drawings, wherein.

DETAILED DESCRIPTION

Figure 1:
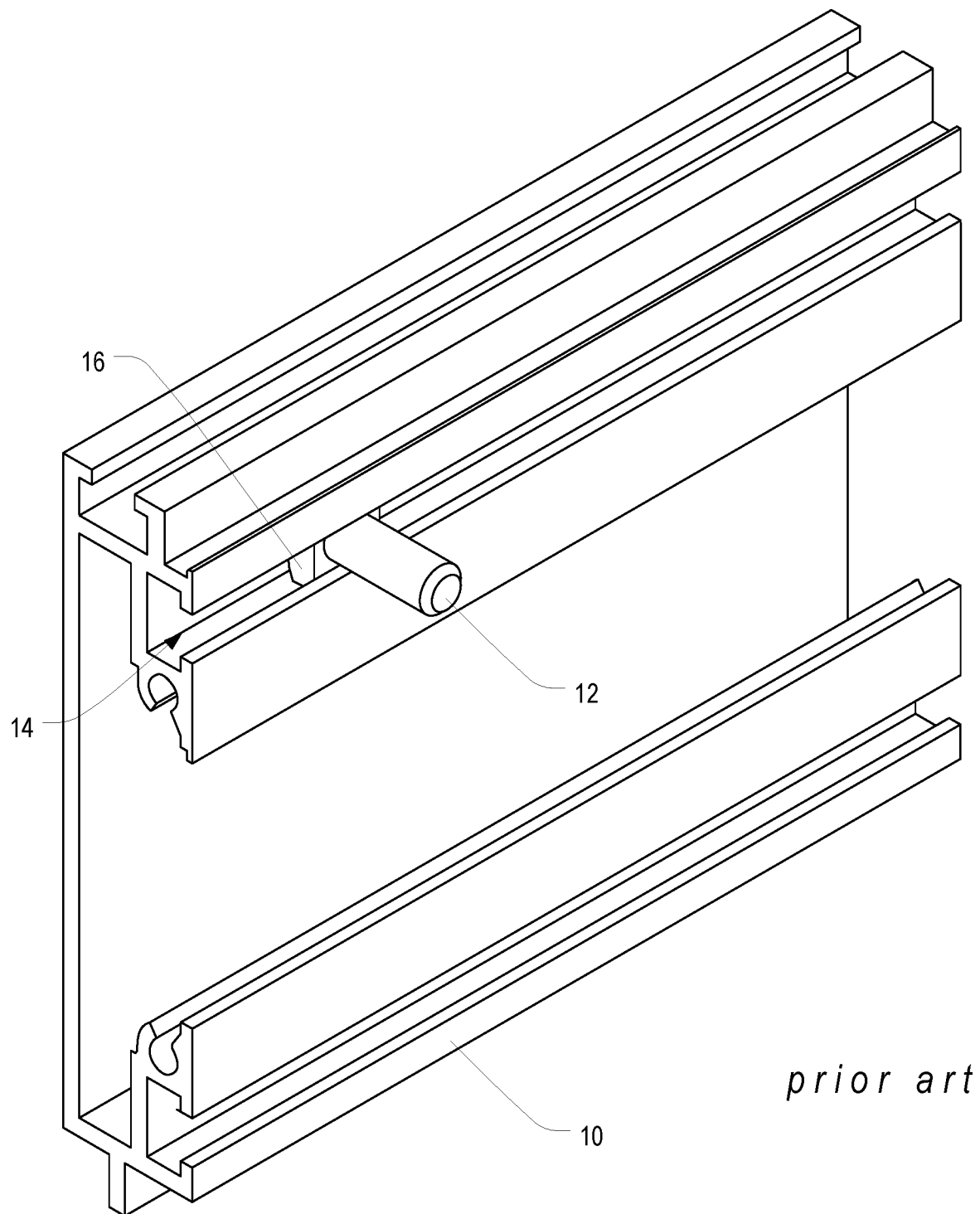
FIG. 1 is a fragmentary isometric view of a prior art slide-type mounting rail with a square head bolt mounted therein.
Figure 2A:
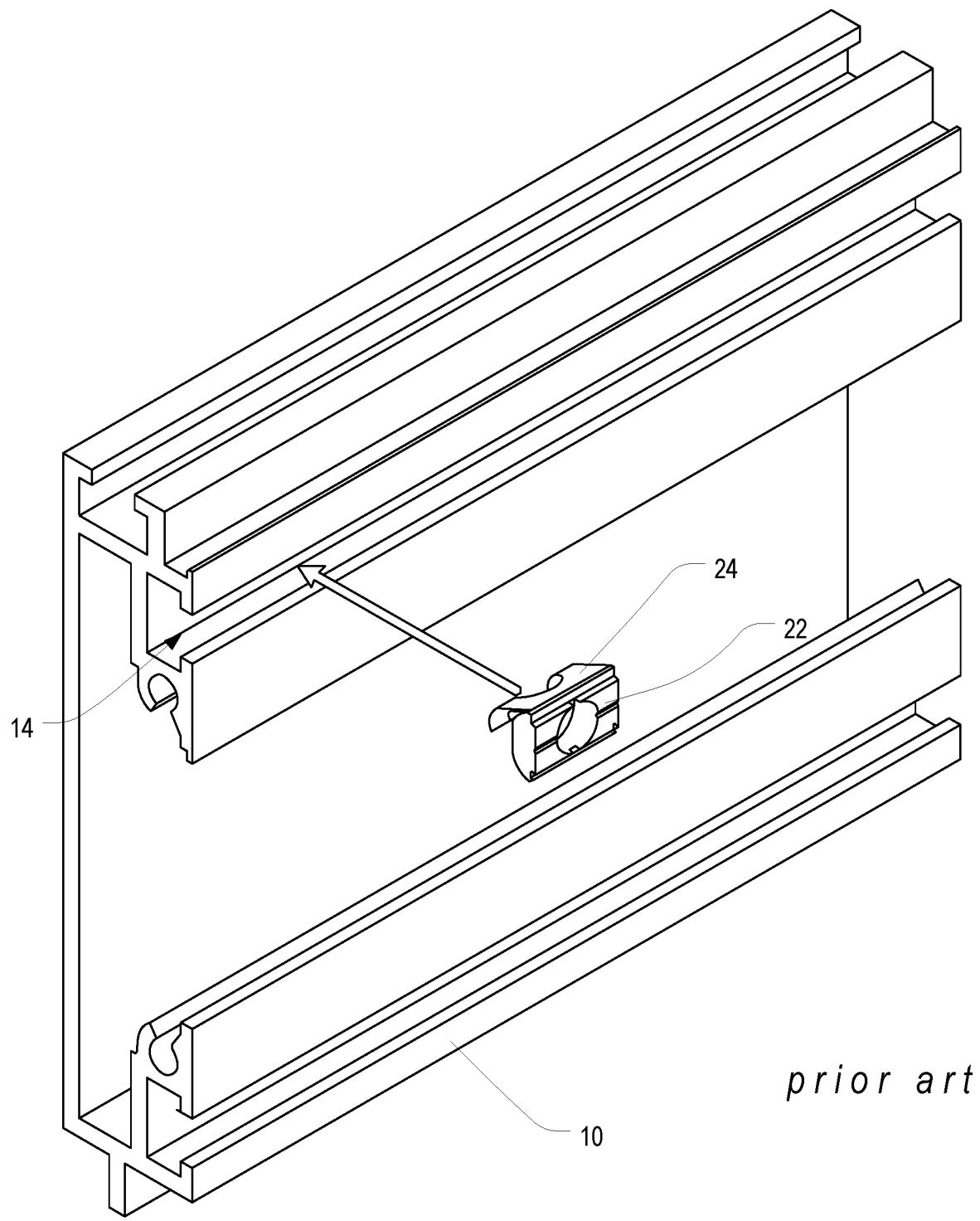
FIG. 2A is a fragmentary isometric view of the slide-type mounting rail of FIG. 1 and a drop-in spring nut.
Figure 2B:
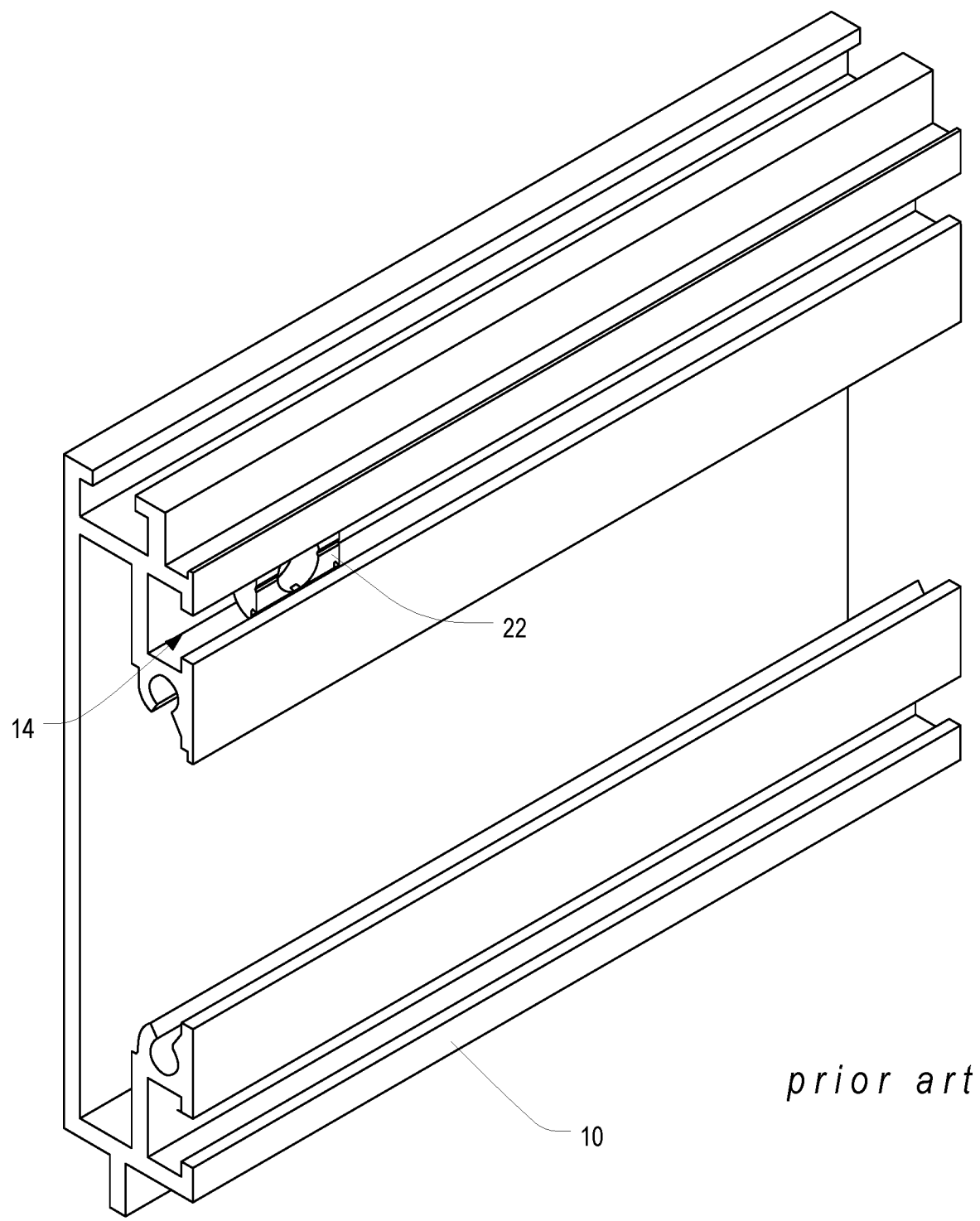
FIG. 2B is a fragmentary isometric view of the slide-type mounting rail of FIG. 2A with the drop-in spring nut mounted therein.
Figure 3:
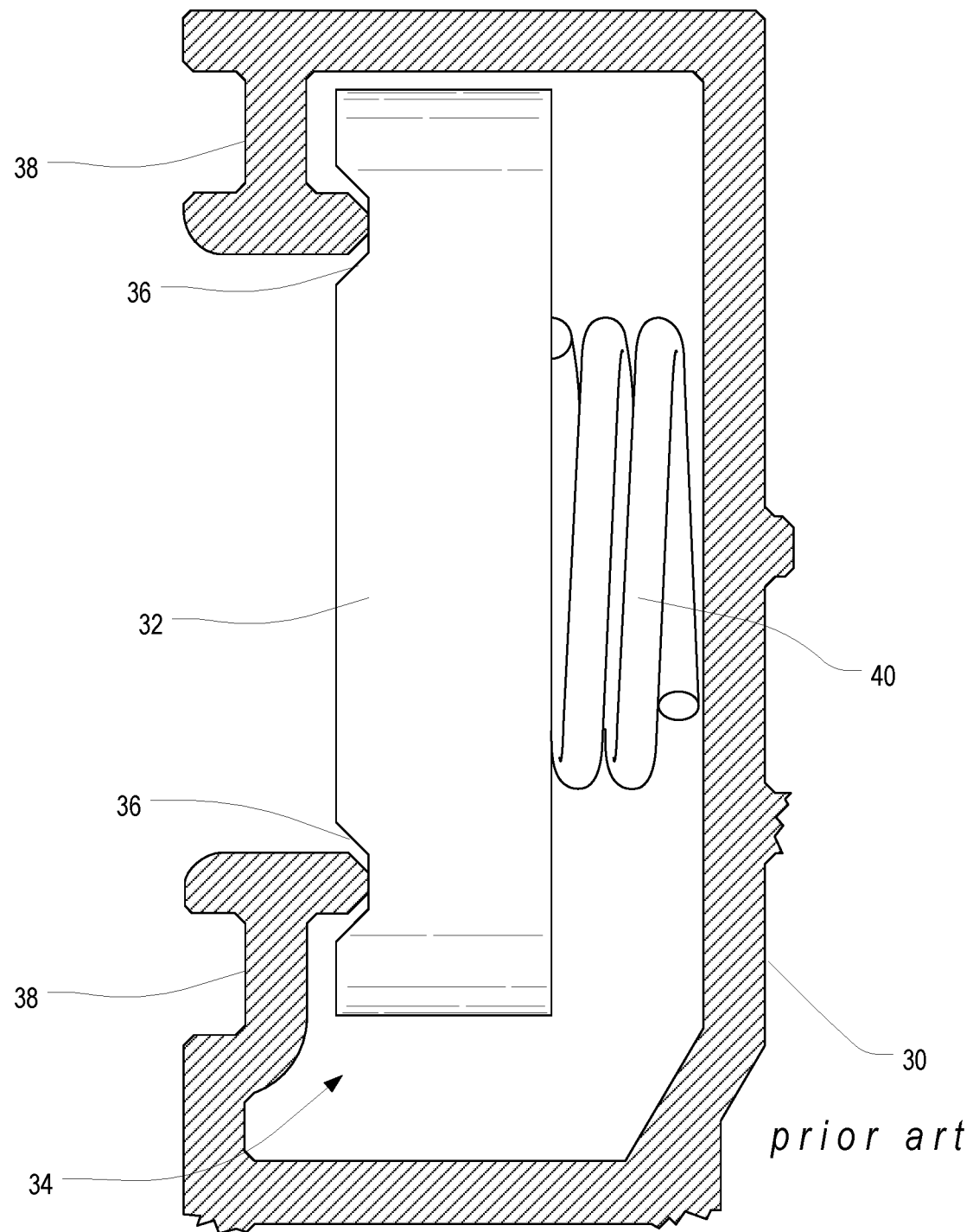
FIG. 3 is a fragmentary end view of a prior art slide-type mounting strut with a channel nut and retaining spring mounted therein.
Figure 4:
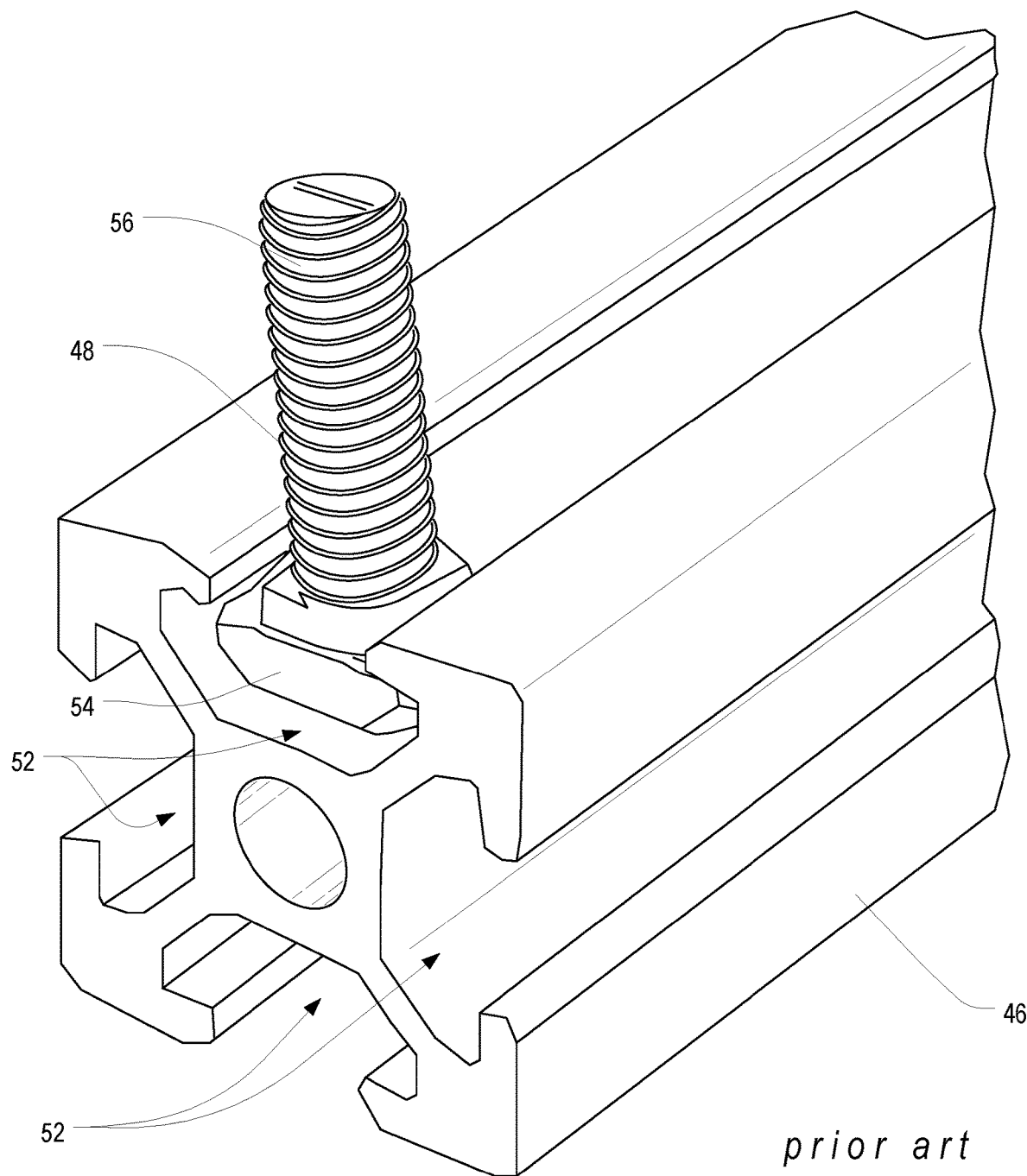
FIG. 4 is a fragmentary perspective view of a prior art slide-type mounting strut with a hammer head bolt mounted therein.
Figure 5:
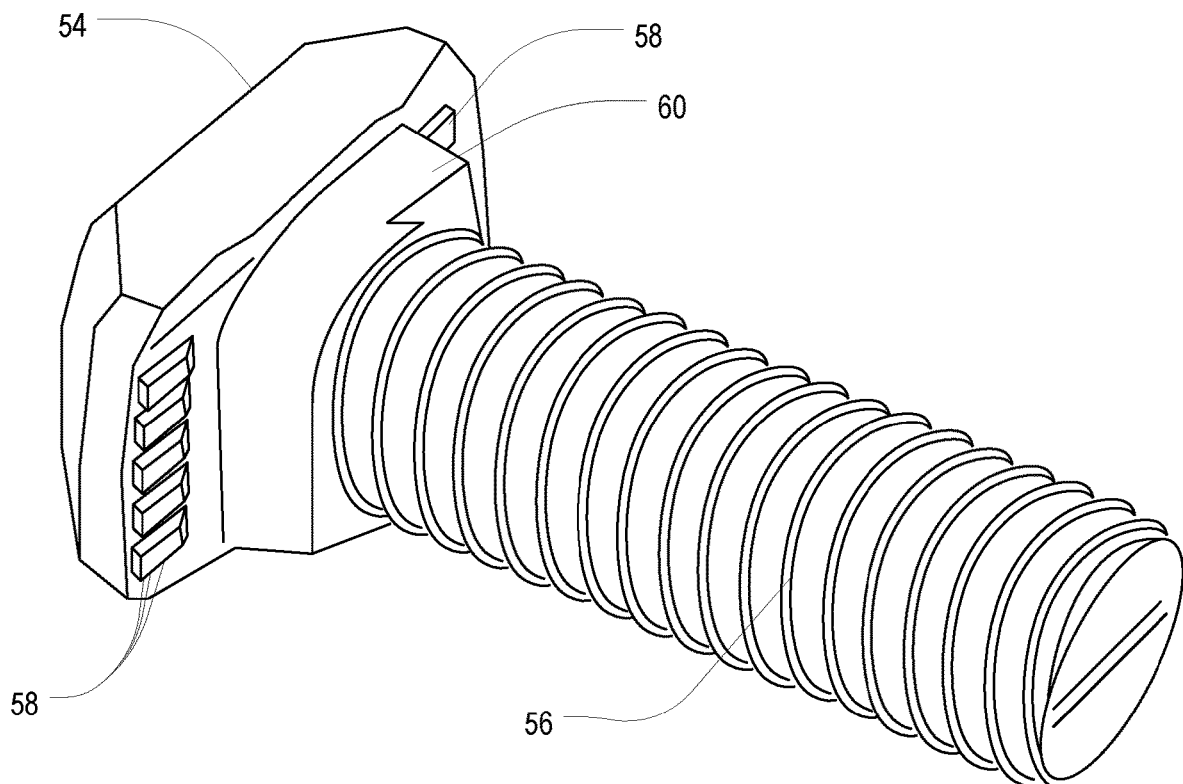
FIG. 5 is a perspective view of the hammer head bolt of FIG. 4.
Figure 6:
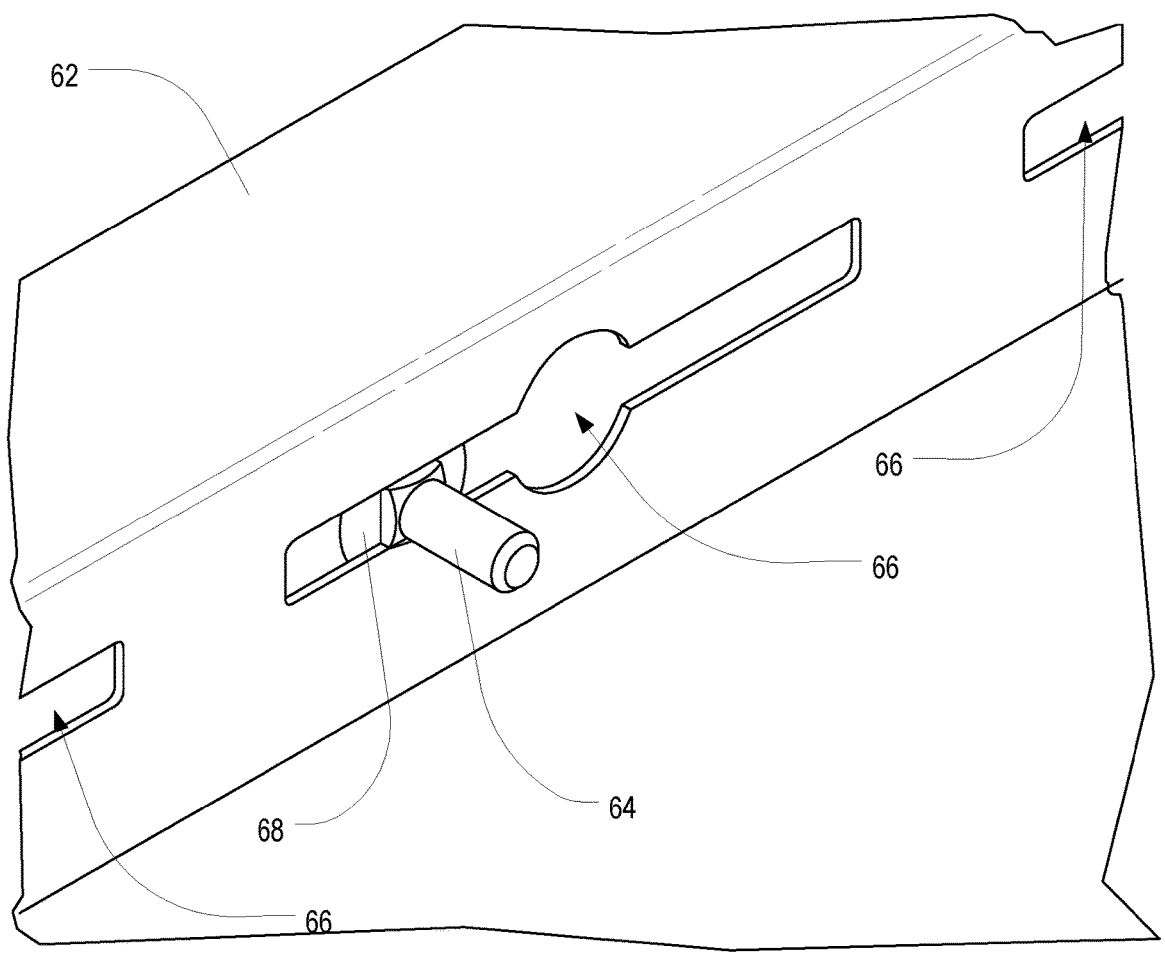
FIG. 6 is a fragmentary isometric view of a prior art slot-type mounting rail with a carriage bolt mounted therein.

As a preliminary matter, it will readily be understood by one having ordinary skill in the relevant art ("Ordinary Artisan") that the present invention has broad utility and application. Furthermore, any embodiment discussed and identified as being "preferred" is considered to be part of a best mode contemplated for carrying out the present invention. Other embodiments also may be discussed for additional illustrative purposes in providing a full and enabling disclosure of the present invention. Furthermore, an embodiment of the invention may incorporate only one or a plurality of the aspects of the invention disclosed herein; only one or a plurality of the features disclosed herein; or combination thereof. Moreover, many embodiments, including adaptations, variations, modifications, and equivalent arrangements, are implicitly disclosed herein and fall within the scope of the present invention.

Accordingly, while the present invention is described herein in detail in relation to one or more embodiments, it is to be understood that this disclosure is illustrative and exemplary of the present invention, and is made merely for the purposes of providing a full and enabling disclosure of the present invention. The detailed disclosure herein of one or more embodiments is not intended, nor is to be construed, to limit the scope of patent protection afforded the present invention in any claim of a patent issuing here from, which scope is to be defined by the claims and the equivalents thereof. It is not intended that the scope of patent protection afforded the present invention be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention. Accordingly, it is intended that the scope of patent protection afforded the present invention is to be defined by the issued claim(s) rather than the description set forth herein.

Additionally, it is important to note that each term used herein refers to that which the Ordinary Artisan would understand such term to mean based on the contextual use of such term herein. To the extent that the meaning of a term used herein—as understood by the Ordinary Artisan based on the contextual use of such term—differs in any way from any particular dictionary definition of such term, it is intended that the meaning of the term as understood by the Ordinary Artisan should prevail.

With regard solely to construction of any claim with respect to the United States, no claim element is to be interpreted under 35 U.S.C. 112(f) unless the explicit phrase "means for" or "step for" is actually used in such claim element, whereupon this statutory provision is intended to and should apply in the interpretation of such claim element. With regard to any method claim including a condition precedent step, such method requires the condition precedent to be met and the step to be performed at least once during performance of the claimed method.

Furthermore, it is important to note that, as used herein, "a" and "an" each generally denotes "at least one," but does not exclude a plurality unless the contextual use dictates otherwise. Thus, reference to "a picnic basket having an apple" describes "a picnic basket having at least one apple" as well as "a picnic basket having apples." In contrast, reference to "a picnic basket having a single apple" describes "a picnic basket having only one apple."

When used herein to join a list of items, "or" denotes "at least one of the items," but does not exclude a plurality of items of the list. Thus, reference to "a picnic basket having cheese or crackers" describes "a picnic basket having cheese without crackers," "a picnic basket having crackers without cheese," and "a picnic basket having both cheese and crackers." Further, when used herein to join a list of items, "and" denotes "all of the items of the list." Thus, reference to "a picnic basket having cheese and crackers" describes "a picnic basket having cheese, wherein the picnic basket further has crackers," as well as describes "a picnic basket having crackers, wherein the picnic basket further has cheese."

Referring now to the drawings, in which like numerals represent like components throughout the several views, one or more preferred embodiments of the present invention are next described. The following description of one or more preferred embodiment(s) is merely exemplary in nature and is in no way intended to limit the invention, its application, or uses.

Figure 7:
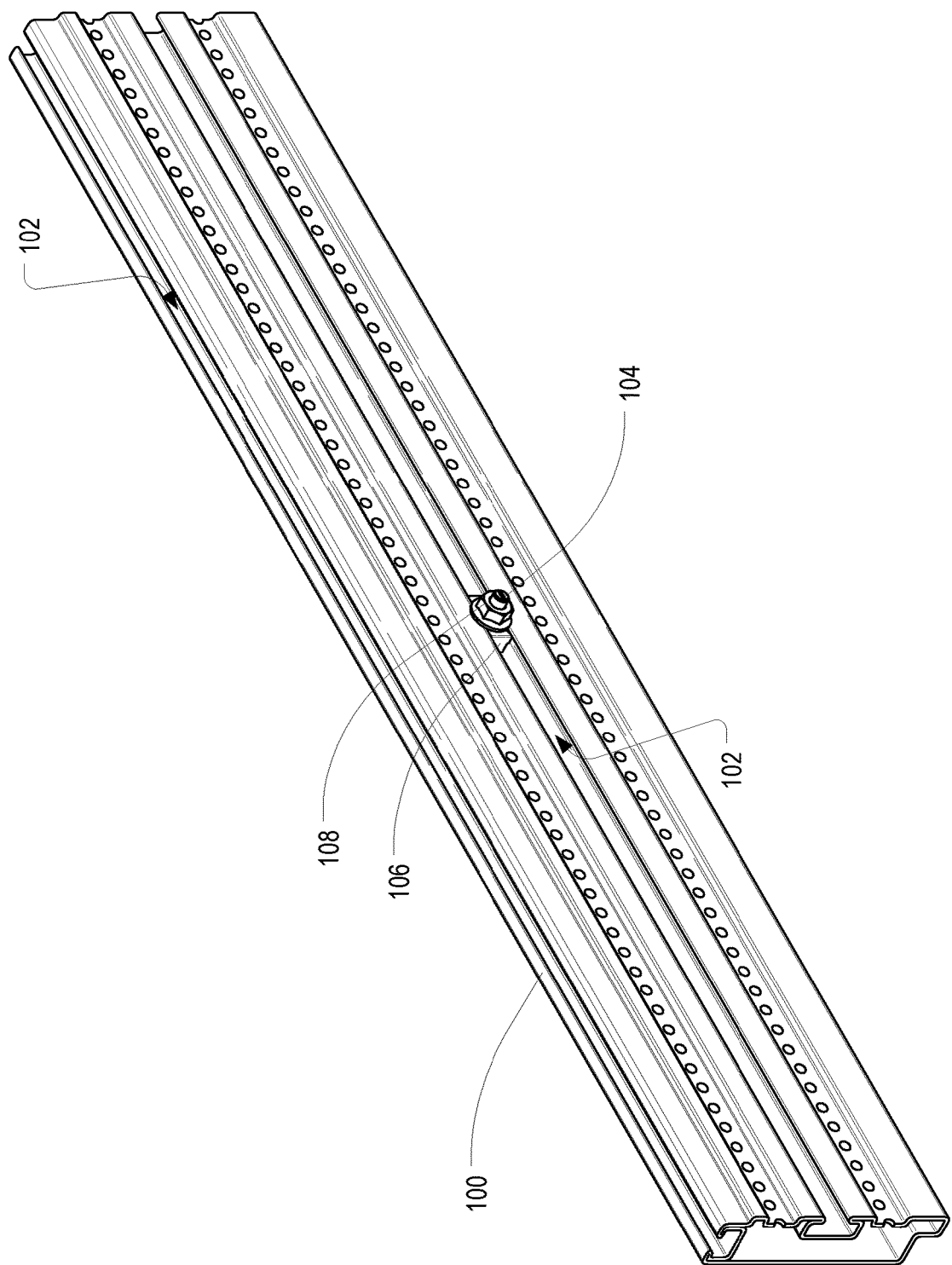
FIG. 7 is an isometric view of a slide-type mounting rail having a bolt and spring retainer inserted therein for receiving a nut in accordance with one or more preferred embodiments of the present invention.

FIG. 7 is an isometric view of a slide-type mounting rail 100 having a bolt 104 and spring retainer 106 inserted therein for receiving a nut 108 in accordance with one or more preferred embodiments of the present invention. It is contemplated that each of the bolt 104 and the spring retainer 106 are made from a durable metal material, and that in at least some embodiments the materials are electrically conductive. In at least some contemplated embodiments, the slide-type mounting rail 100 has an extruded construction with one or more channels or grooves 102 formed therein for use in accommodating slide hardware. In other contemplated embodiments, the slide-type mounting rail 100 is constructed from steel tubing or formed sheet metal. It is further contemplated that the slide-type mounting rail 100 can include other slots, apertures, or other openings formed or machined into different surfaces thereof for accommodating fasteners, accessories, or other types of structural features.

Within the context of electronic equipment enclosures and cabinets, the slide-type mounting rail 100 can function as a structural component of the frame that supports the enclosure or it can serve as an internal or external appurtenant structure, such as an equipment or accessory mounting rail. It is further contemplated that the slide-type mounting rail 100 can be oriented horizontally, vertically, or in any other orientation relative to the enclosure or cabinet. As can be seen in FIG. 7, a bolt 104 and a spring retainer 106 in accordance with one or more preferred embodiments of the present invention have been inserted into a centrally-located T-slot channel 102 of the slide-type mounting rail 100, and a nut 108 has been threaded onto the bolt 104.

Figure 8A:
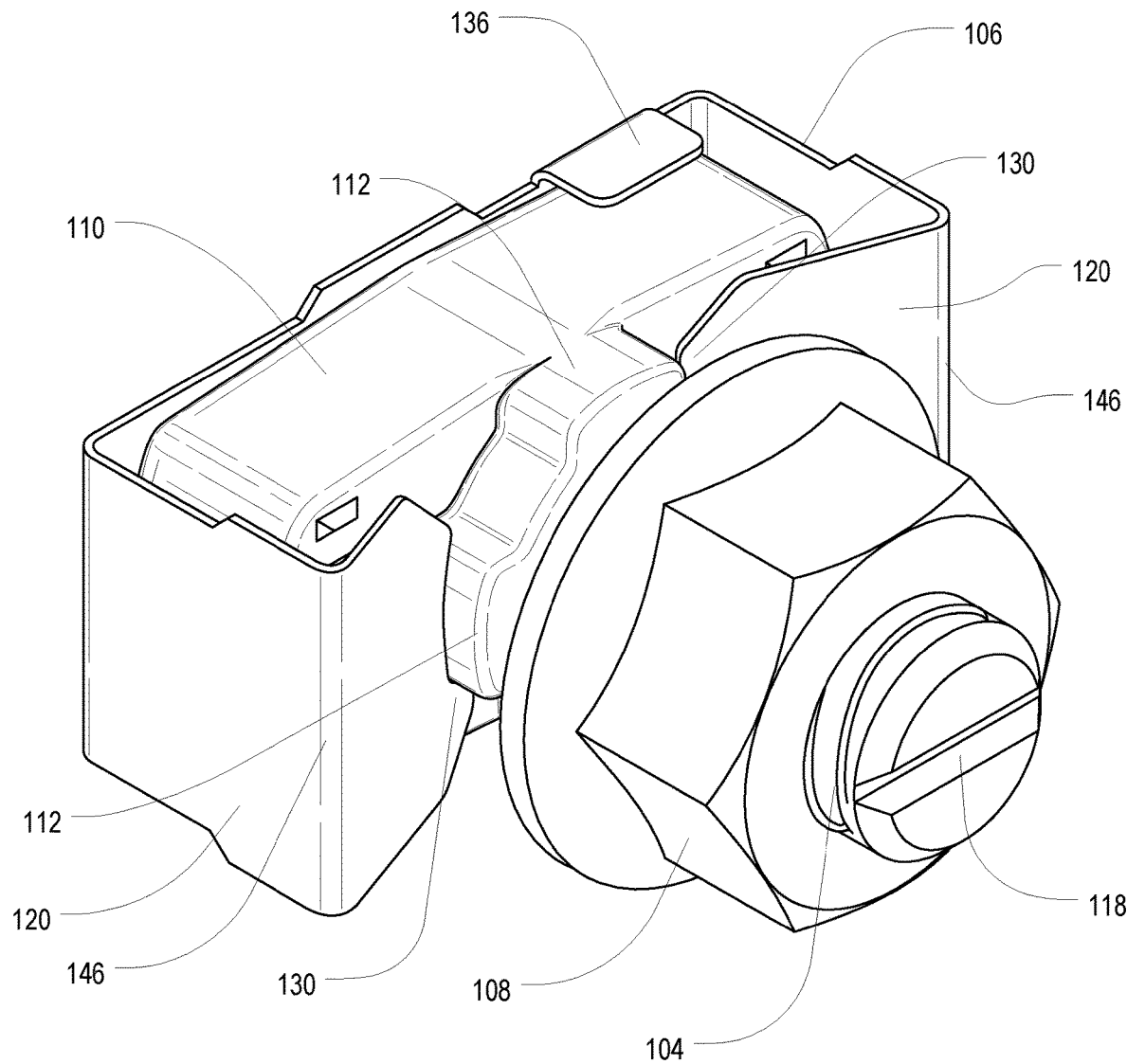
FIG. 8A is an isometric view of the bolt, spring retainer, and nut of FIG. 7, shown outside of the rail.
Figure 8B:
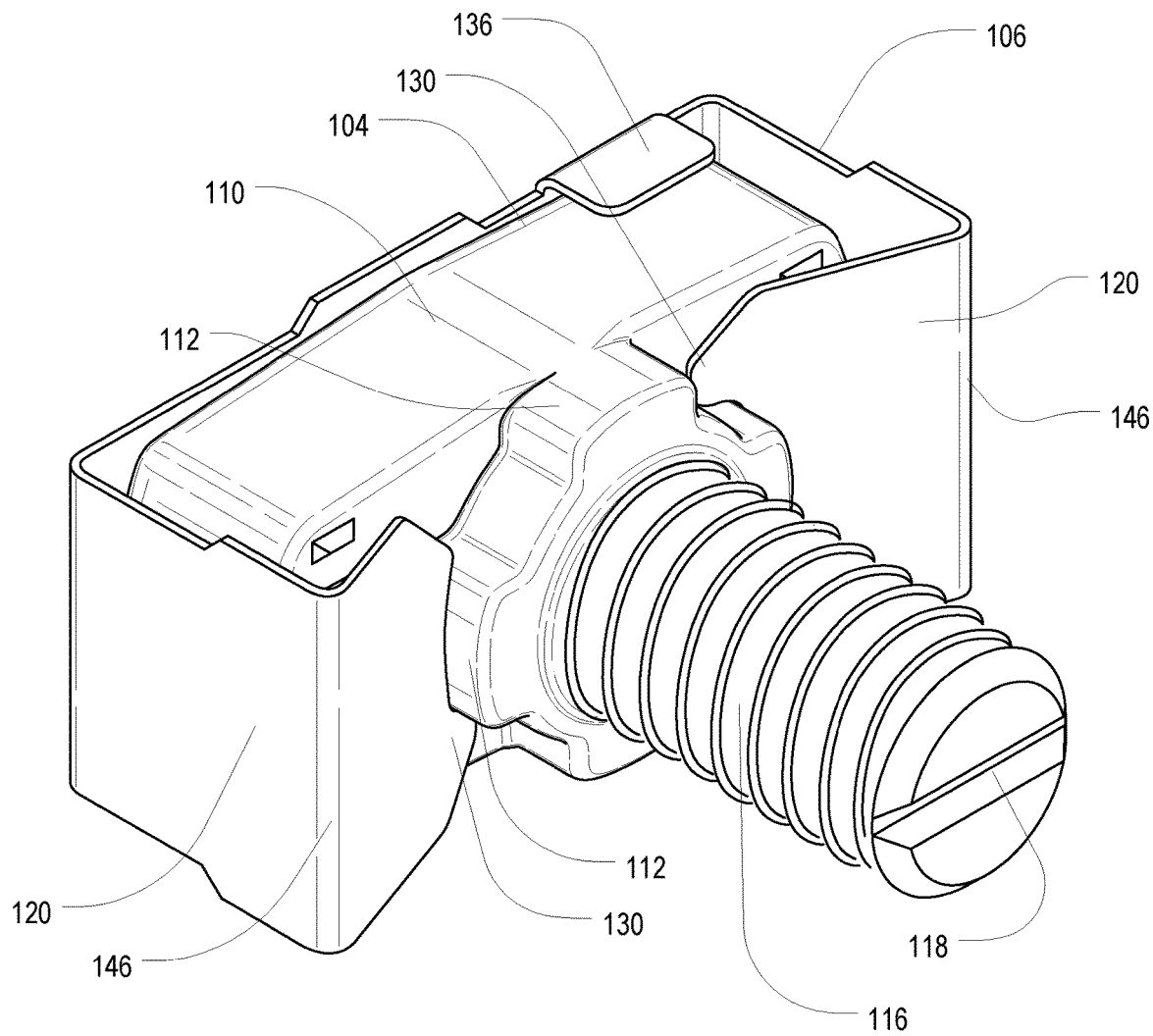
FIG. 8B is an isometric view of the bolt and spring retainer of FIG. 8A.

FIG. 8A is an isometric view of the bolt 104, spring retainer 106, and nut 108 of FIG. 7, and FIG. 8B is an isometric view of the bolt 104 and spring retainer 106 of FIG. 8A, shown in isolation. As shown in FIGS. 8A and 8B, a head 110 of the bolt 104 is retained within the spring retainer 106 by a pair of deflectable spring arms 120. In at least some embodiments, it is contemplated that the bolt 104 and spring retainer 106 are provided in a preassembled state where they are paired together in the manner shown in FIG. 8B.

Figure 9:
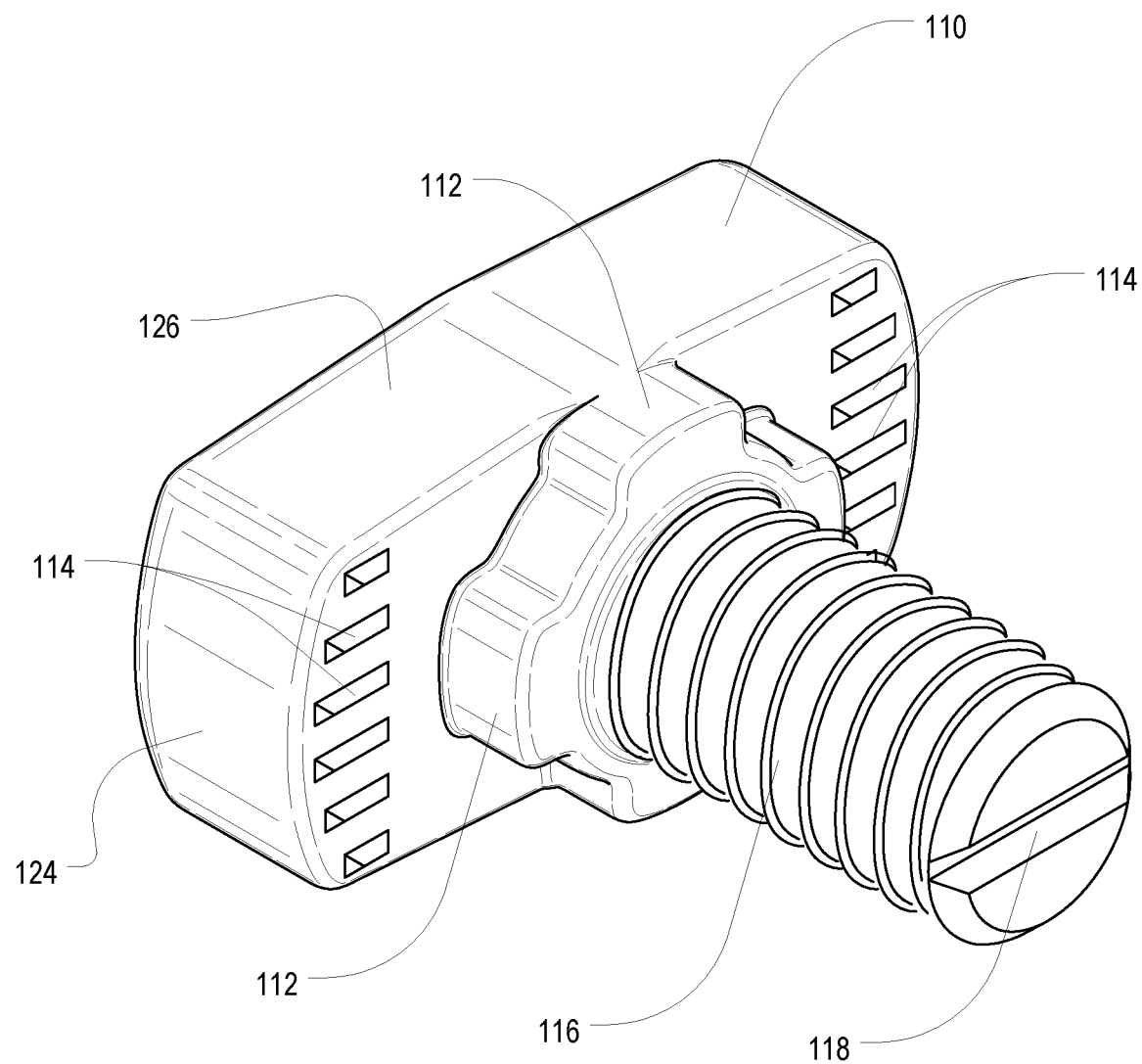
FIG. 9 is an isometric view of the bolt of FIGS. 8A and 8B.
Figure 10:
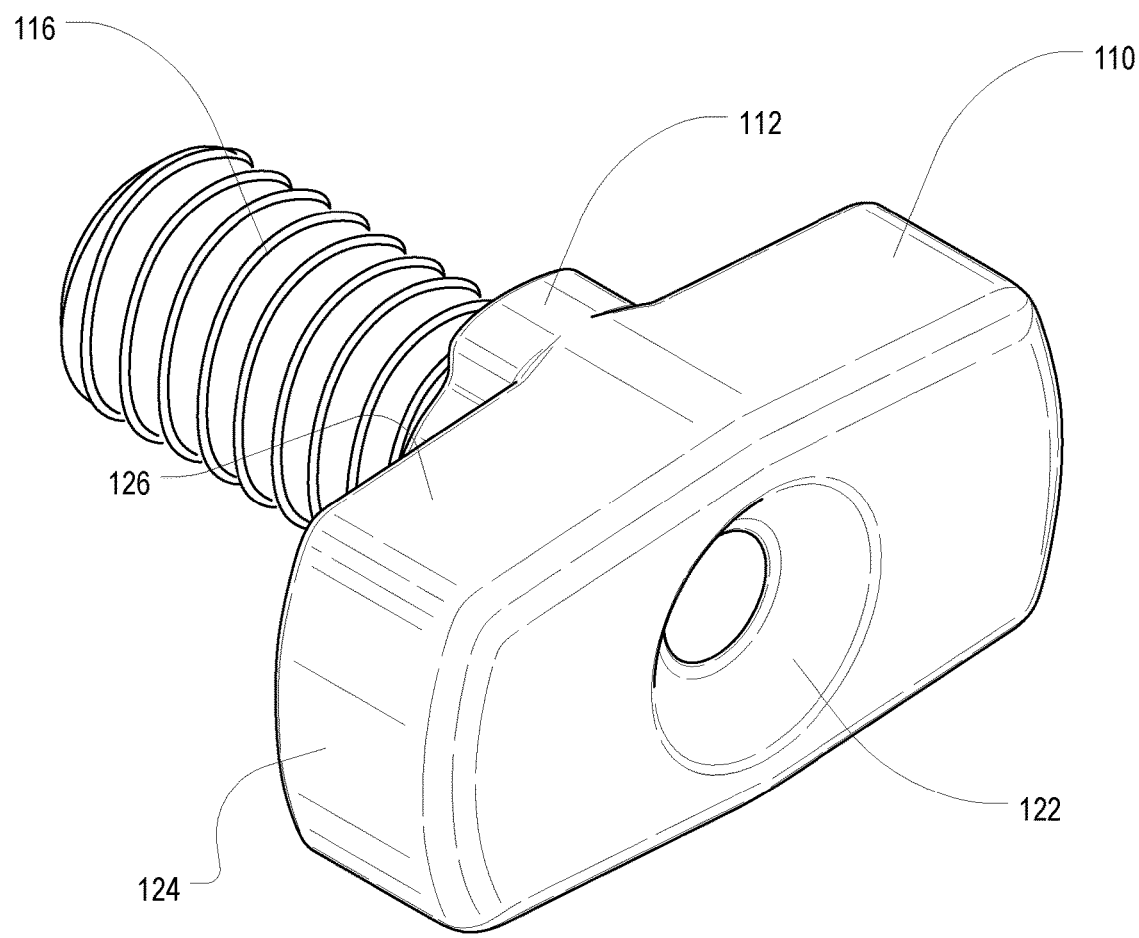
FIG. 10 is a reverse isometric view of the bolt of FIG. 9.

FIG. 9 is an isometric view of the bolt 104 of FIGS. 8A and 8B, and FIG. 10 is a reverse isometric view of the bolt 104 of FIG. 9. The bolt head 110 features a pair of short sides 124 and a pair of long sides 126, which, together, provide the bolt head 110 with a generally oblong or rectangular shape. It is contemplated that each of the short and long sides 124,126 may exhibit some degree of curvature or they may exhibit no curvature at all. With reference to FIG. 10, the bolt head 110 preferably includes a pivot recess 122 that is centrally located along a rear surface thereof.

The bolt 104 further includes a cylindrical shaft 116 that is at least partially threaded and protrudes from a front of the bolt head 110. The end of the bolt shaft 116 includes a groove or channel 118 across a surface thereof. At a proximal end of the shaft 116, where the shaft intersects the bolt head 110, the bolt 104 includes a plurality of cam bosses 112 arranged around the shaft 116 at evenly spaced intervals. Each cam boss 112 is generally box-shaped with rounded edges, and each protrudes beyond the cross-sectional profile of the cylindrical shaft 116 but within the cross-sectional profile of the bolt head 110. In the embodiment of FIGS. 9 and 10, the bolt 104 includes four cam bosses 112, although more or fewer cam bosses are also contemplated.

With reference to FIG. 9, the bolt 104 further includes a series of cutting ribs 114 arranged at opposite sides of the bolt head 110 along the front-facing surface thereof. Each cutting rib 114 includes a sharp surface or edge for cutting through the paint or other coating of another metal surface when the ribs are applied against the other metal surface, and, more particularly, when the bolt 104 is rotated and tightened against such surface. In this regard, the cutting ribs 114 facilitate a metal-on-metal connection between the bolt 104 and the other metal surface.

Figure 11:
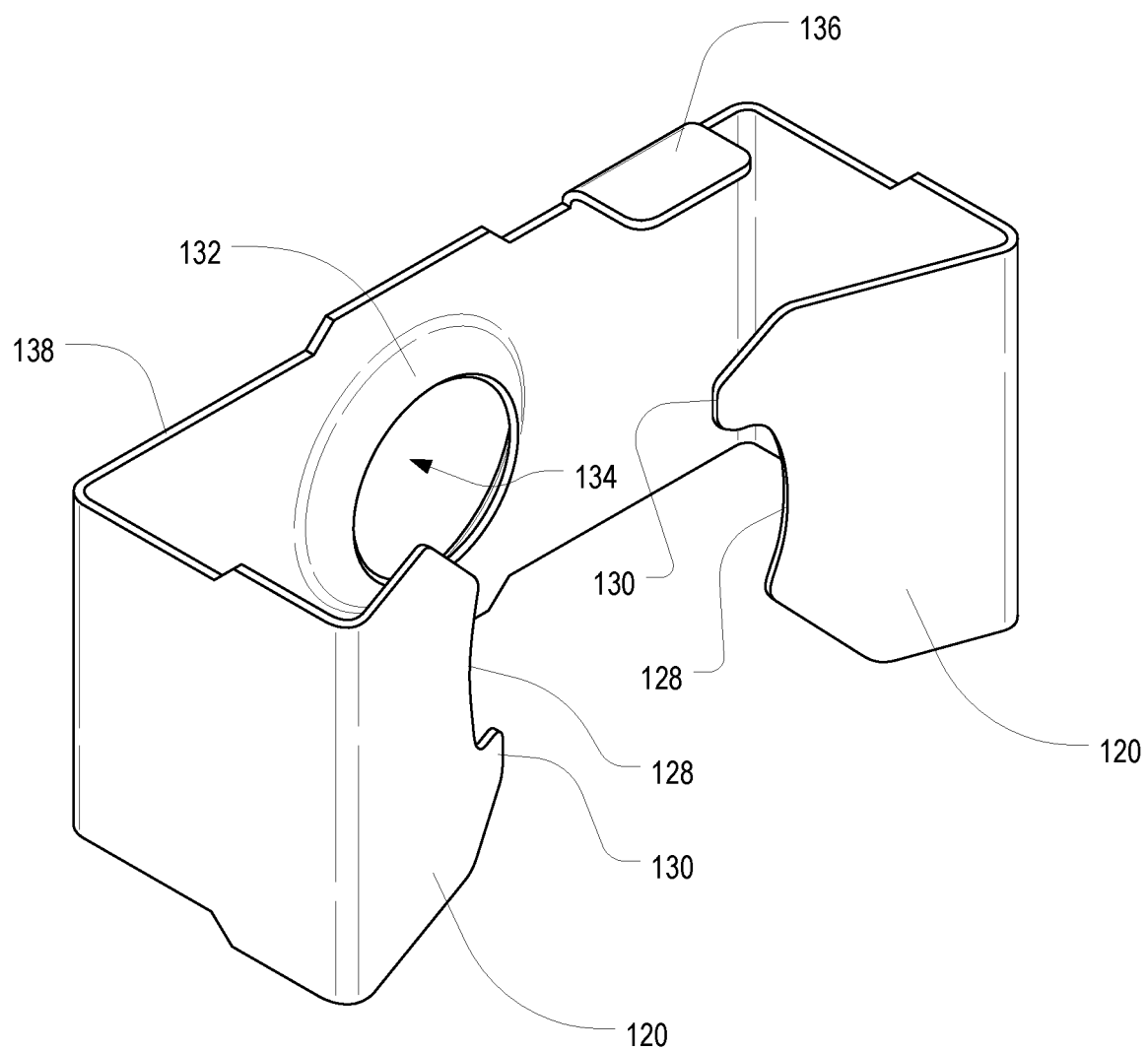
FIG. 11 is an isometric view of the spring retainer of FIGS. 8A and 8B.
Figure 12:
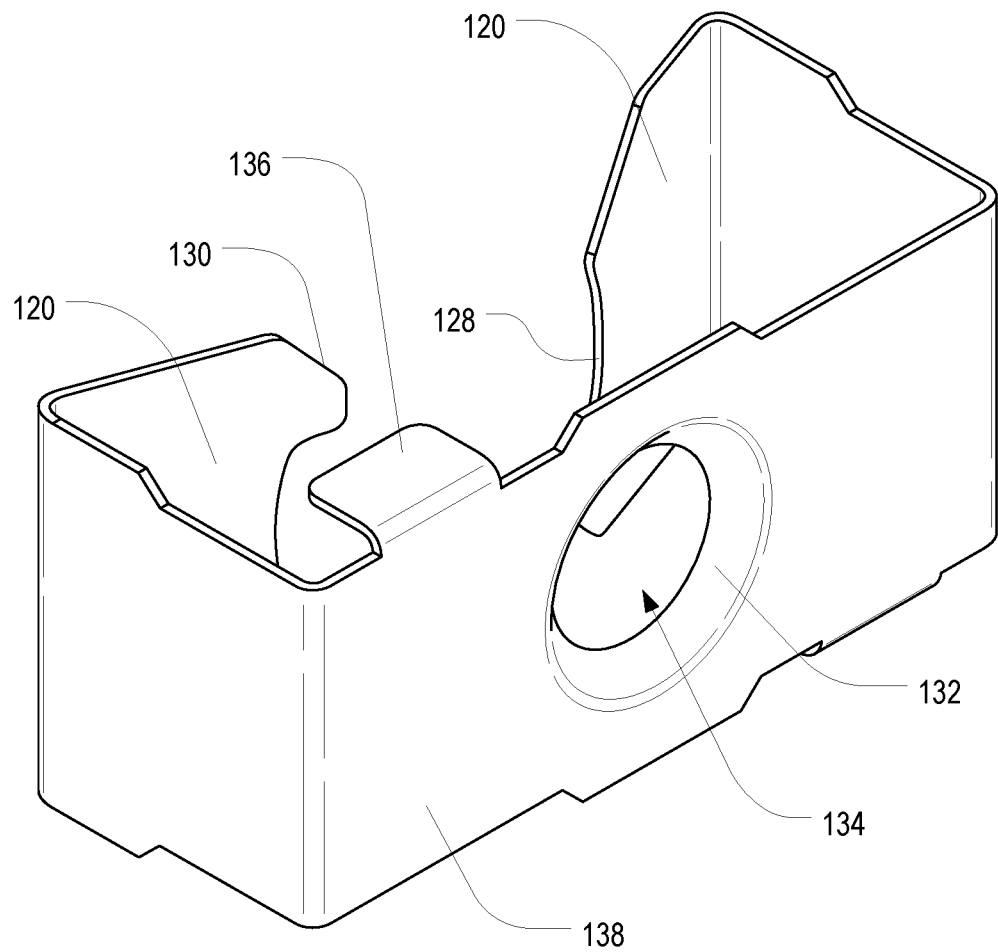
FIG. 12 is a reverse isometric view of the spring retainer of FIG. 11.

FIG. 11 is an isometric view of the spring retainer 106 of FIGS. 8A and 8B, and FIG. 12 is a reverse isometric view of the spring retainer 106 of FIG. 11. The spring retainer 106 includes a rear wall 138 and a pair of spring arms 120 that extend from respective ends of the rear wall 138. Each spring arm 120 extends in a forward direction and then inward such that distal ends of the cage arms 120 generally extend toward one another. Under application of an outward pushing force, the spring arms 120 are outwardly deflectable by a small margin and are biased to spring back to an undeflected state upon removal of the force. Distal ends of the spring arms 120 include a concavely curved outer edge 128 with a locking cam 130 arranged at one side thereof. As will be explained in greater detail below, the locking cams 130 interact with the cam bosses 112 on the bolt 104 to help position the bolt head 110 relative to the spring retainer 106.

The spring retainer 106 further includes a pivot boss 132 that is centrally located along a length of the rear wall 138. The pivot boss 132 protrudes in an inward direction and interacts with the pivot recess 122 of the bolt 104 to help position the bolt relative to the spring retainer 106. In at least some embodiments, the pivot boss 132 is formed at least in part from a countersunk aperture 134 that penetrates the rear wall 138. In this regard, edges of the rear wall 138 that define the aperture 134 protrude forward and are adapted to interact with the pivot recess 122 of the bolt 104. In other contemplated embodiments, the pivot boss 132 includes a solid protrusion. As further shown in FIGS. 11 and 12, the spring retainer 106 includes tab stops 136 that extend forward from sides of the rear wall 138 adjacent the spring arms 120. The tab stops 136 limit rotation of the bolt 104 within the spring retainer 106.

With further reference to FIG. 8B, the bolt 104 is held and aligned relative to the spring retainer 106 by a variety of features. When assembled together, the bolt head 110 is positioned within the spring retainer 106 with the shaft 116 protruding forward therefrom. The spring arms 120 are deflected at least slightly from an undeflected state by cam bosses 112 at opposite sides of the bolt 104. The bias of the spring arms 120 against the cam bosses 112 clamps the bolt 104 within the spring retainer 106. In particular, the outer surface of each cam boss 112 abuts the concavely curved outer edge 128 of one of the spring arms 120. The bolt 104 is retained in an aligned position by the pivot boss 122, which is received within the pivot recess 132 of the spring retainer 106. In particular, seating the pivot boss 122 within the pivot recess 132 ensures that the bolt 104 remains centered within the spring retainer 106 even as the bolt is rotated. The tab stops 136 arranged on sides of the rear wall 138 and adjacent the spring arms 120 prevent the bolt 104 from rotation in a direction blocked by the tab stops 136.

Figure 13:
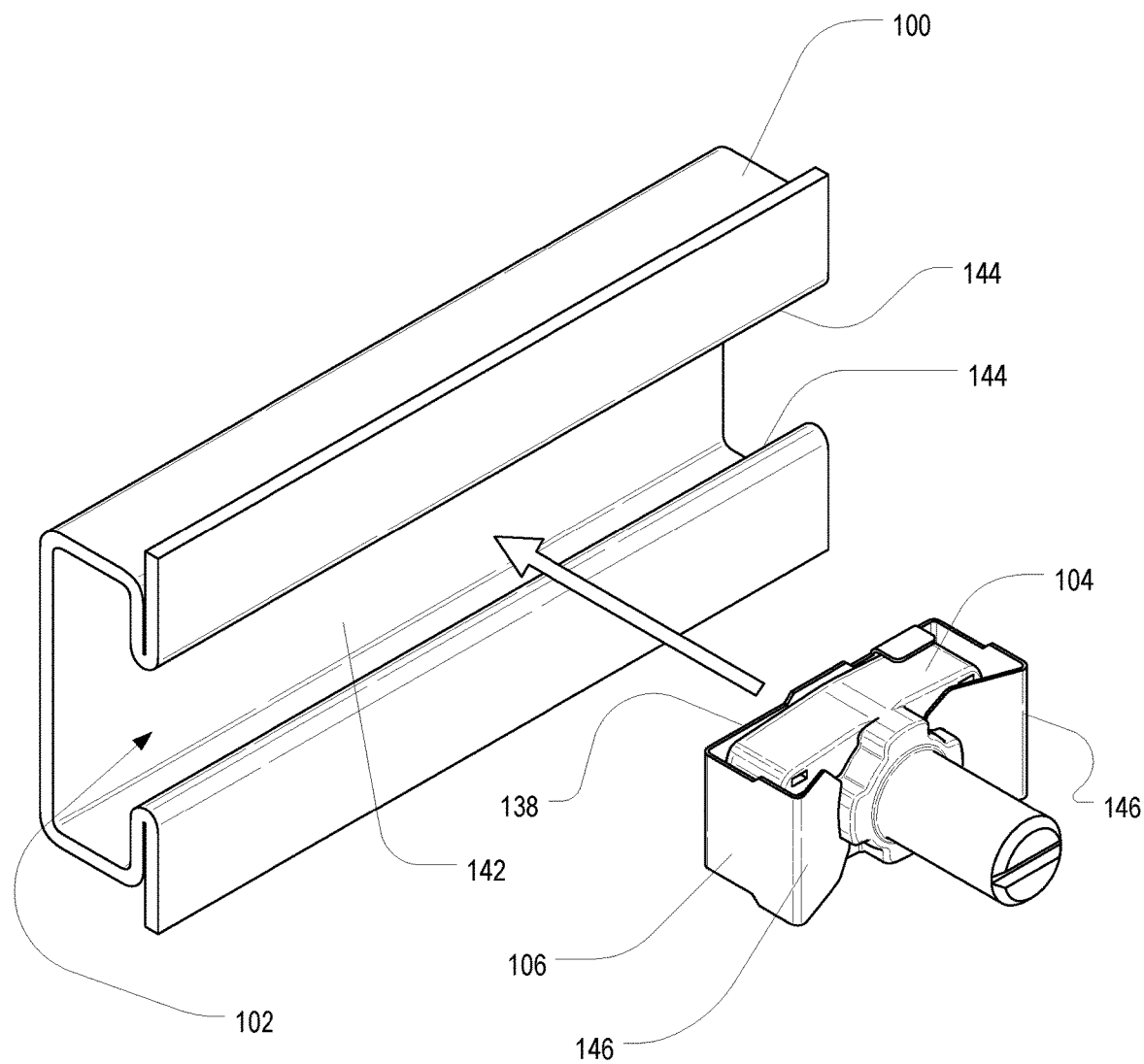
FIG. 13 is an enlarged fragmentary isometric view of a portion of the mounting rail of FIG. 7 showing the bolt and spring retainer being inserted into the rail.
Figure 14:
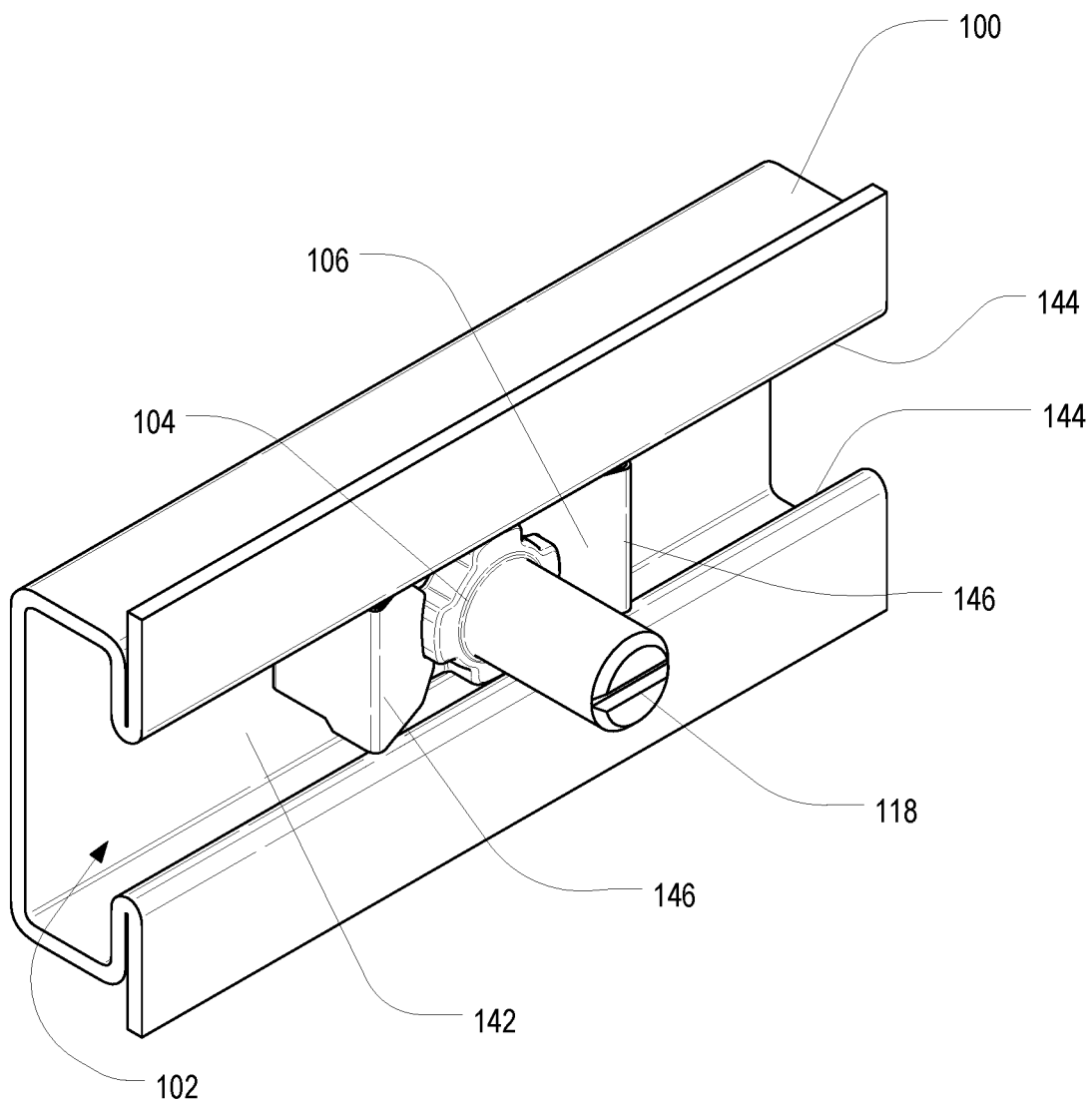
FIG. 14 is a fragmentary isometric view similar to that of FIG. 13 but showing the bolt and spring retainer fully inserted in the rail.

FIG. 13 is a fragmentary isometric view of a portion of the mounting rail 100 of FIG. 7 showing the bolt 104 and spring retainer 106 being inserted into the rail 100, and FIG. 14 is a fragmentary isometric view similar to that of FIG. 13 but showing the bolt 104 and spring retainer 106 fully inserted in the rail 100. In a contemplated method of installing the bolt 104 and spring retainer 106 in a slide-type mounting rail 100, the pre-assembled bolt 104 and spring retainer 106 are inserted into a T-slot channel 102 of the mounting rail 100 until the rear wall 138 of the spring retainer 106 reaches the rear wall 142 of the channel 102. Once received within the T-slot channel 140, bent edges 146 of the spring arms 120 are obstructed by the opposing ledges 144 of the T-slot channel 102. With the bent edges 146 of the spring arms 120 blocked by the ledges 144 of the T-slot channel 102, the spring retainer 106 is prevented from rotation within the channel. However, the pre-assembled bolt 104 and spring retainer 106 is slidable within the channel along a length thereof to adjust the position of the bolt 104 and spring retainer 106.

Figure 15:
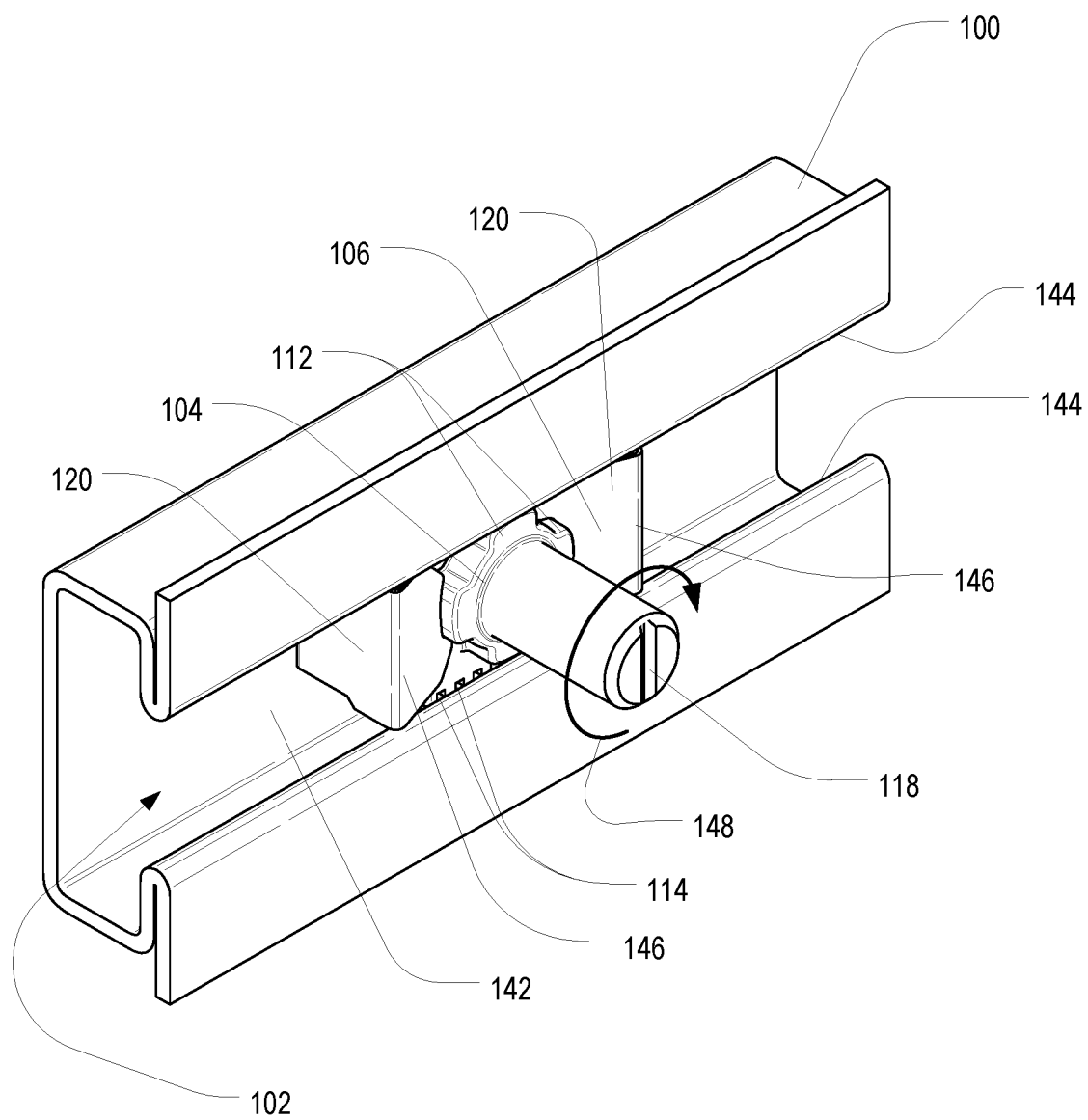
FIG. 15 is a fragmentary isometric view similar to that of FIG. 14 but showing the bolt rotated into the locked position.

FIG. 15 is a fragmentary isometric view similar to that of FIG. 14 but showing the bolt 104 rotated into the locked position or locked state. To lock the bolt 104 at a desired location along the mounting rail 100, the bolt 104 is rotated ninety degrees, or one quarter turn, in a clockwise direction 148. It is contemplated that the biasing force of the spring arms 120 is such that the bolt 104 can be rotated by hand without the aid of tools. During rotation of the bolt 104, the unengaged cam bosses 112 will press against angled outer edges of the locking cams 130, thereby causing the spring arms 120 to be deflected outward. Once the unengaged cam bosses 112 have cleared the locking cams 130, the spring arms 120 will spring back to clamp against the previously unengaged cam bosses 112 to retain the bolt 104. It is contemplated that, as the unengaged cam bosses 112 spring back upon clearing the locking cams 130, the bolt 104 clicks or snaps into the locked position or state, thereby providing an installer with confirmation that the bolt 104 has been properly locked. Additionally, the orientation of the groove 118 at the end surface of the bolt shaft 116 can provide an installer with confirmation that the bolt 104 has been properly locked. In particular, once the groove has been re-oriented by ninety degrees, the bolt has been properly locked. Advantageously, the end surface of the bolt shaft 116, particularly including the groove 118, is visible to an installer even after the bolt 104 is inserted into the channel 102 and fully installed.

Figure 16:
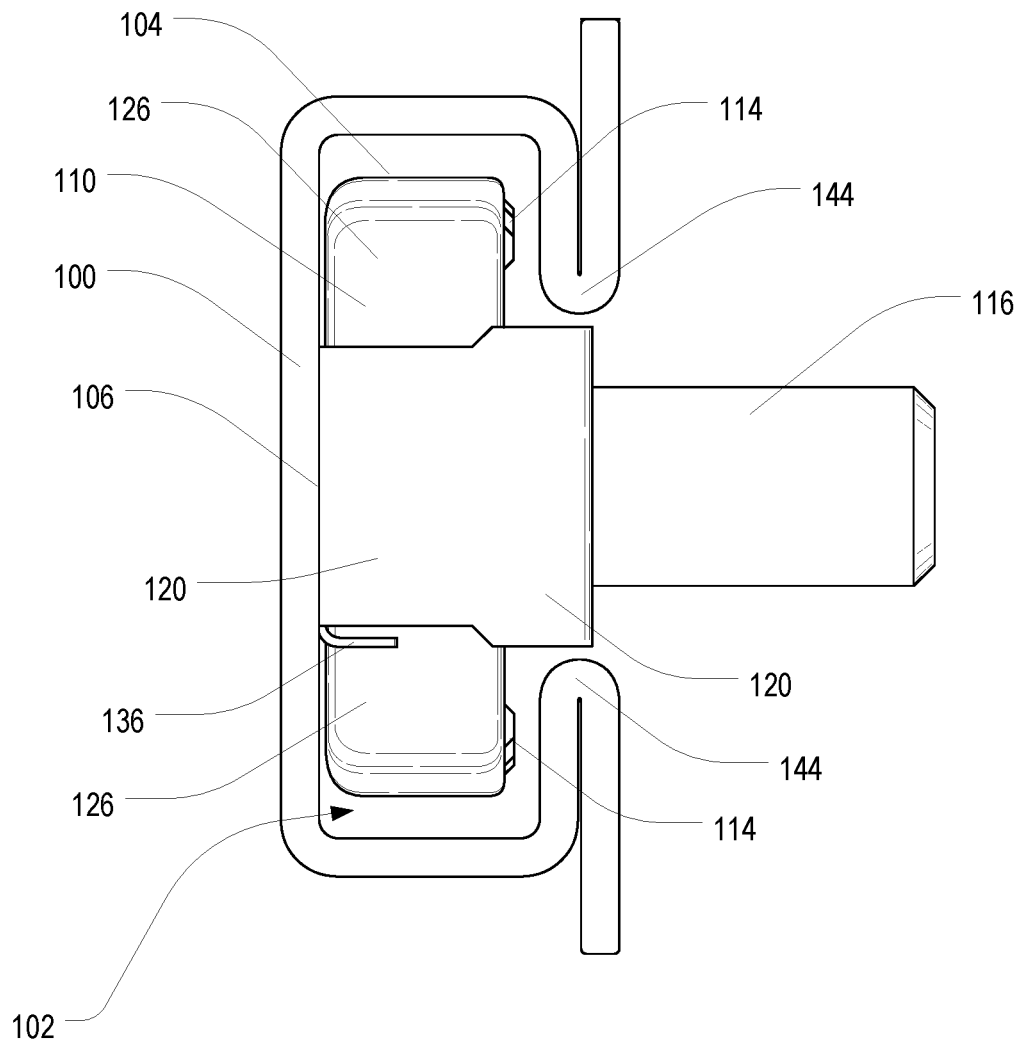
FIG. 16 is a fragmentary end view of the mounting rail, bolt, and spring retainer of FIG. 15.

FIG. 16 is a fragmentary end view of the mounting rail 100, bolt 104, and spring retainer 106 of FIG. 15. As shown in FIG. 16, the bolt 104 has been rotated to the locked position or state. When in the locked position or state, the long sides 126 of the bolt head 110 are positioned across the T-slot channel 102, thereby preventing the bolt 104 from exiting the channel. With reference to FIGS. 15 and 16, the tab stops 136 prevent the bolt 104 from further rotation in the clockwise direction. Additionally, with reference to FIG. 15, the locking cams 130 prevent the bolt head 110 from unintentionally rotating back in the counterclockwise direction.

Figure 17:
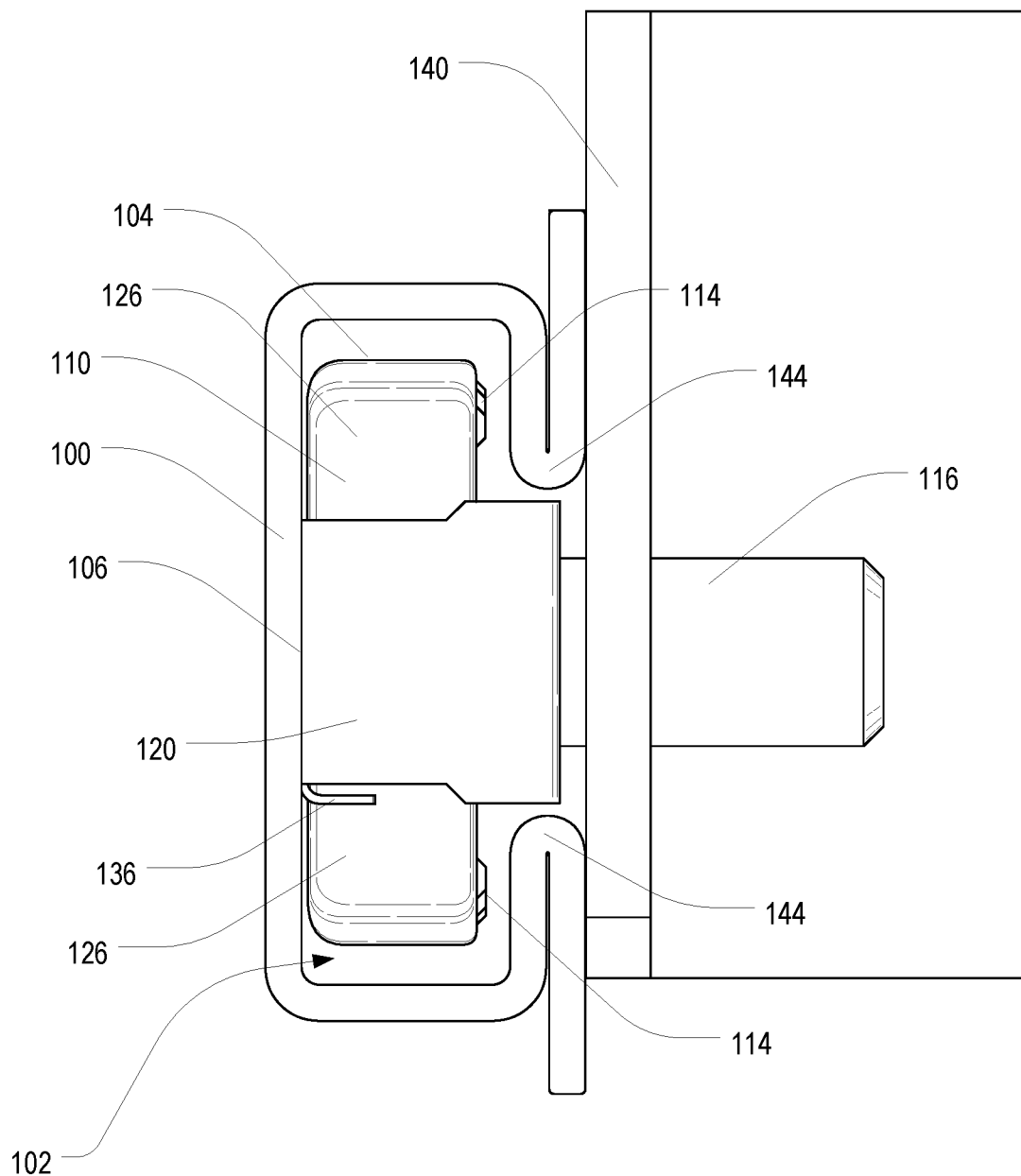
FIG. 17 is a fragmentary end view of the mounting rail, bolt, and spring retainer of FIG. 16, shown with a vertical structure placed in position against the mounting rail.

FIG. 17 is a fragmentary end view of the mounting rail 100, bolt 104, and spring retainer 106 of FIG. 16, shown with a vertical structure 140 placed in position against the mounting rail 100. With the bolt 104 in the locked position or state, additional structures, such as equipment components, cable management accessories, and structural components can be secured or fastened using the bolt 104. As shown in FIG. 17, a vertical structure 140 is positioned against the mounting rail 100 with the bolt shaft 116 extending through an aperture of the vertical structure 140.

Figure 18:
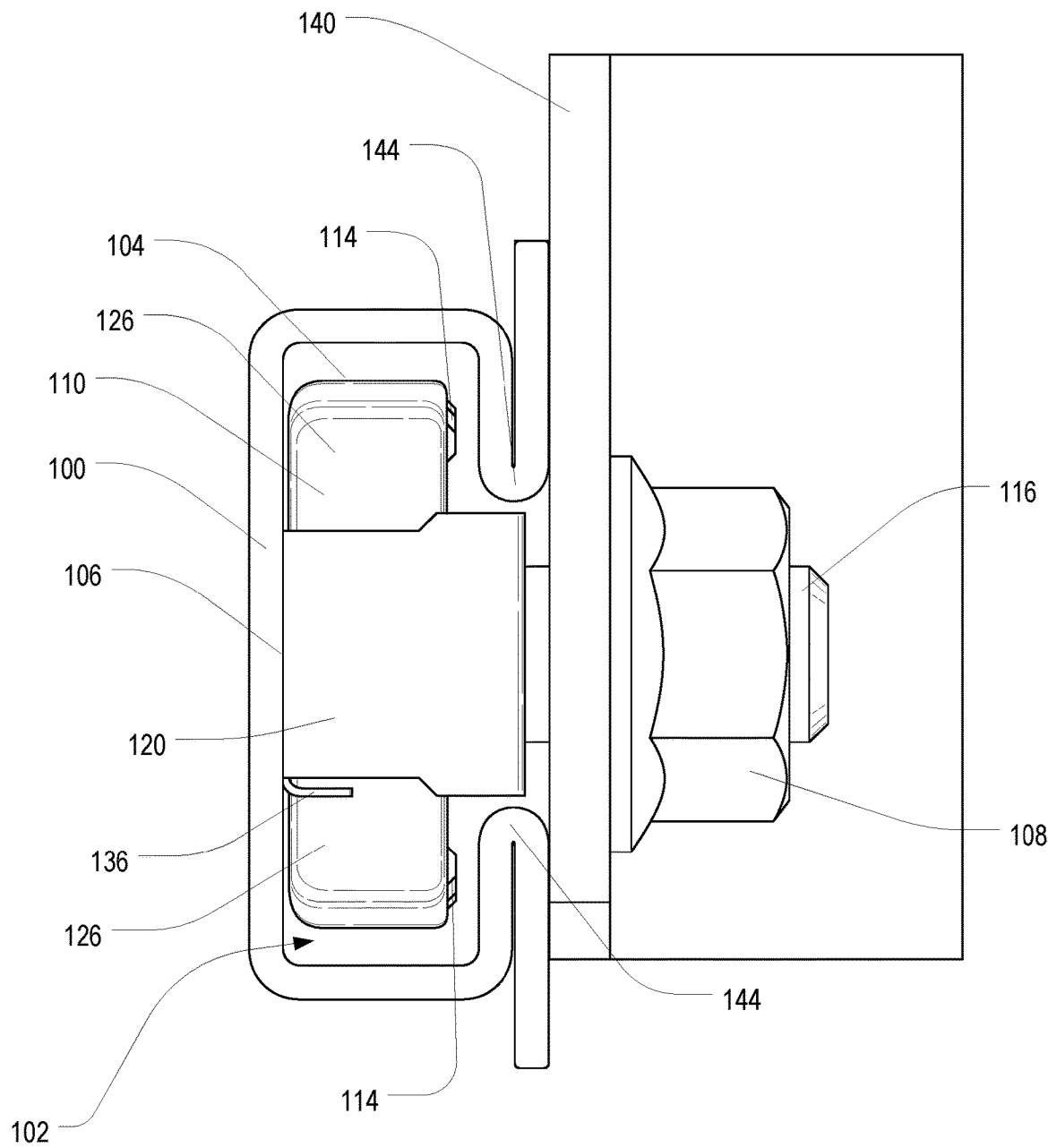
FIG. 18 is a fragmentary end view of the mounting rail, bolt, and spring retainer of FIG. 17, shown with a nut loosely installed on the end of the bolt.
Figure 19:
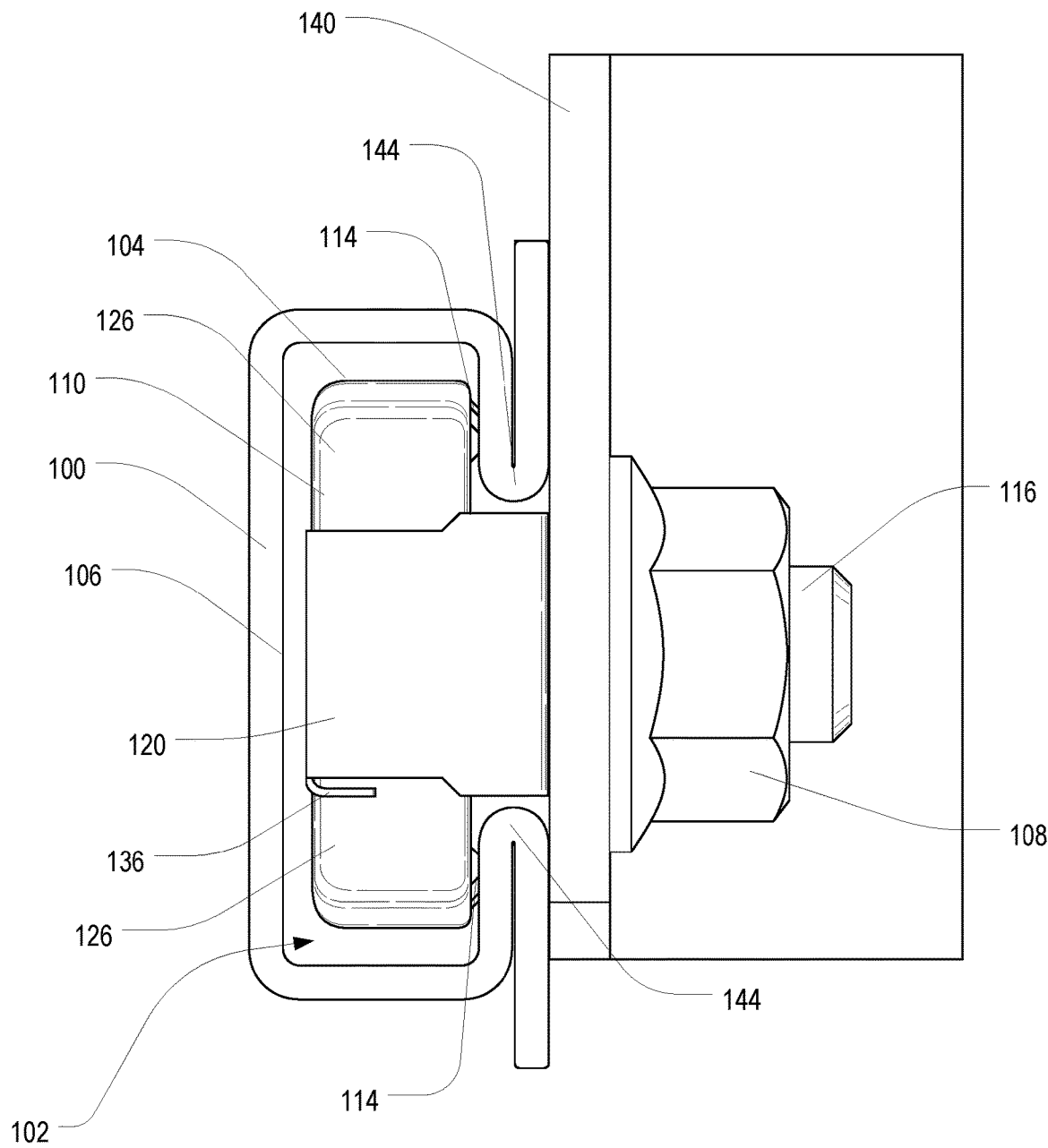
FIG. 19 is a fragmentary end view of the mounting rail, bolt, and spring retainer of FIG. 18, shown with the nut tightened on the bolt.
Figure 20:
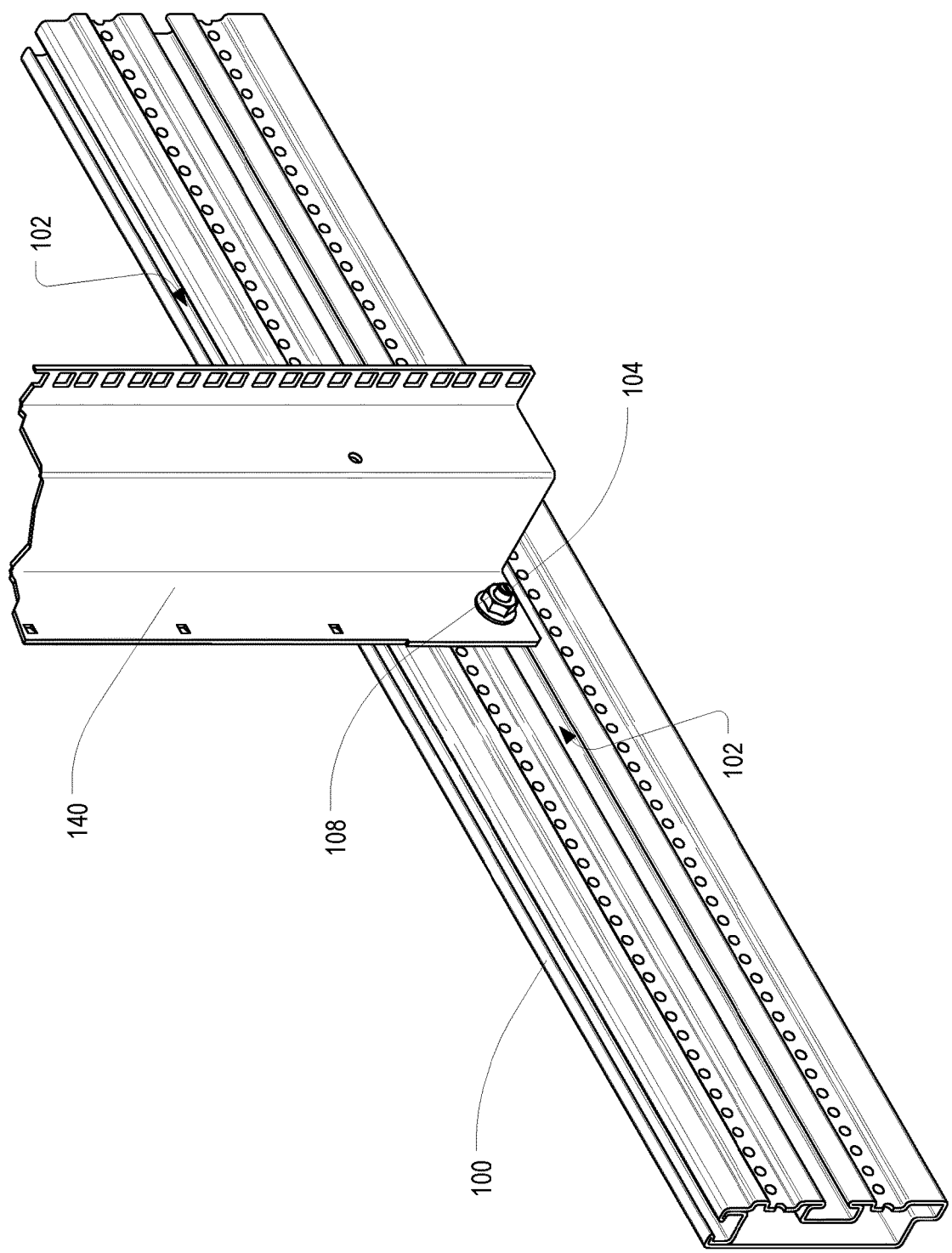
FIG. 20 is an isometric view of the mounting rail, bolt, spring retainer, and vertical structure of FIG. 19.

FIG. 18 is a fragmentary end view of the mounting rail 100, bolt 104, and spring retainer 106 of FIG. 17, shown with a nut 108 loosely installed on the end of the bolt 104. With the vertical structure 140 in position against the mounting rail 100, the nut 108 can be positioned onto the distal end of the bolt shaft 116 at the other side of the vertical structure 140. FIG. 19 is a fragmentary end view of the mounting rail 100, bolt 104, and spring retainer 106 of FIG. 18, shown with the nut 108 tightened on the bolt 104, and FIG. 20 is an isometric view of the mounting rail 100, bolt 104, spring retainer 106, nut 108, and vertical structure 140 of FIG. 19. As the nut 108 is tightened on the shaft 116, the cutting ribs 114 on the bolt head 110 cut through any paint or coating on the interior-facing surface of the T-slot channel 102, thereby establishing metal-on-metal contact between the bolt 104 and the mounting rail 100 to facilitate an electrical bonding connection. Additionally, it is contemplated that the nut 108 may itself have serrated ribs on the contact surface that abuts the vertical structure 140. In this regard, metal-on-metal contact (and electrical bonding) may also be established between the nut 108 and the vertical structure 140. Taken together, the metal-on-metal connections form an electrical bonding path from the vertical structure 140 through the nut 108, through the bolt 104, and to the mounting rail 100.

Figure 21:
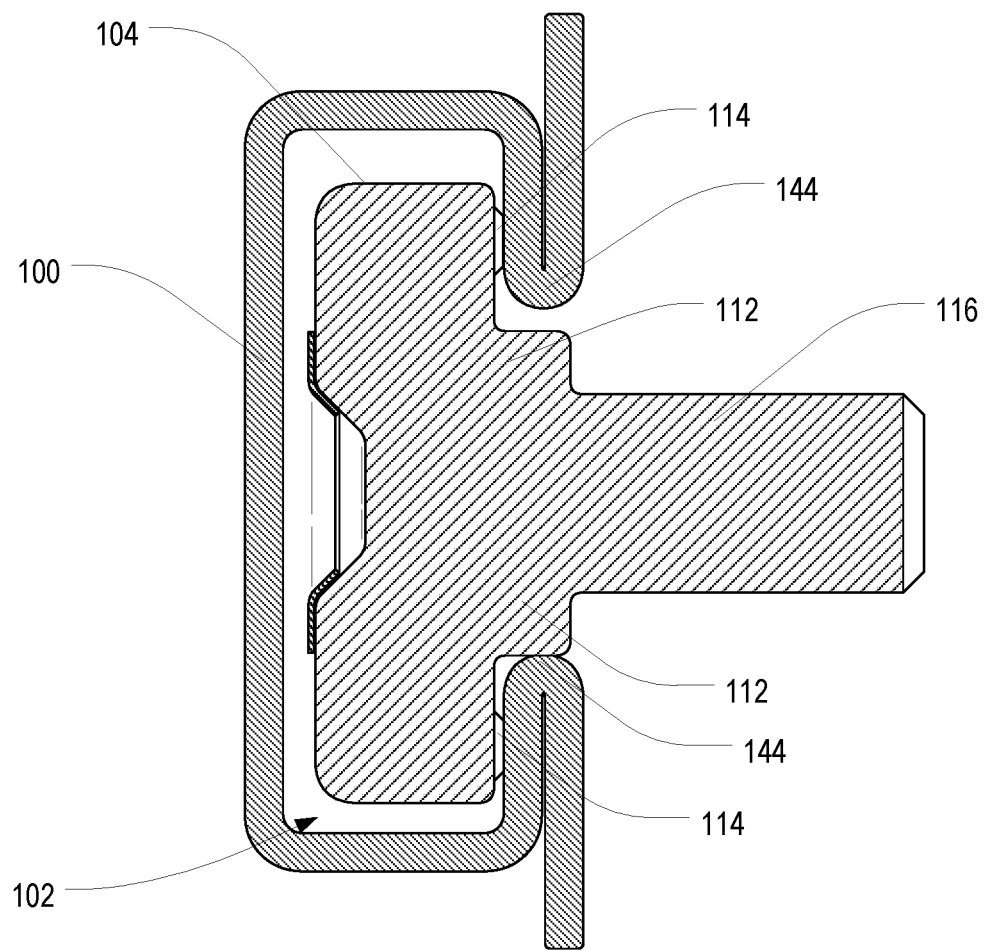
FIG. 21 is a cross-sectional view of the mounting rail, bolt, and spring retainer of FIG. 15 shown with a portion of the bolt engaging a lower ledge of the T-slot channel.

FIG. 21 is a cross-sectional view of the mounting rail 100, bolt 104, and spring retainer 106 of FIG. 15 but shown with a portion of the bolt 104 engaging a lower ledge 144 of the T-slot channel 102. For a slide-type mounting rail 100 in a horizontal orientation, it is contemplated that the mounting rail 100 is capable of providing load-bearing support. In particular, it is contemplated that a portion of an equipment load is transmittable through the bolt 104 upon which the load is directly or indirectly mounted and to the mounting rail 100 at the point where the bolt 104 engages the ledge 144 of the T-slot channel 102.

It is contemplated that a bolt 104 and spring retainer 106 in accordance with one or more aspects of the present invention can be installed or removed after the enclosure or cabinet has been fully assembled. Furthermore, it is contemplated that the bolt 104 and spring retainer 106 can be unlocked to facilitate repositioning of the nut 104 and spring retainer 106 within the channel 102. To unlock the bolt 104, the bolt 104 can be rotated in a counterclockwise direction. In this regard, it is contemplated that unlocking the bolt 104 may require a greater rotational force than what is required to lock the bolt during installation.

Figure 22:
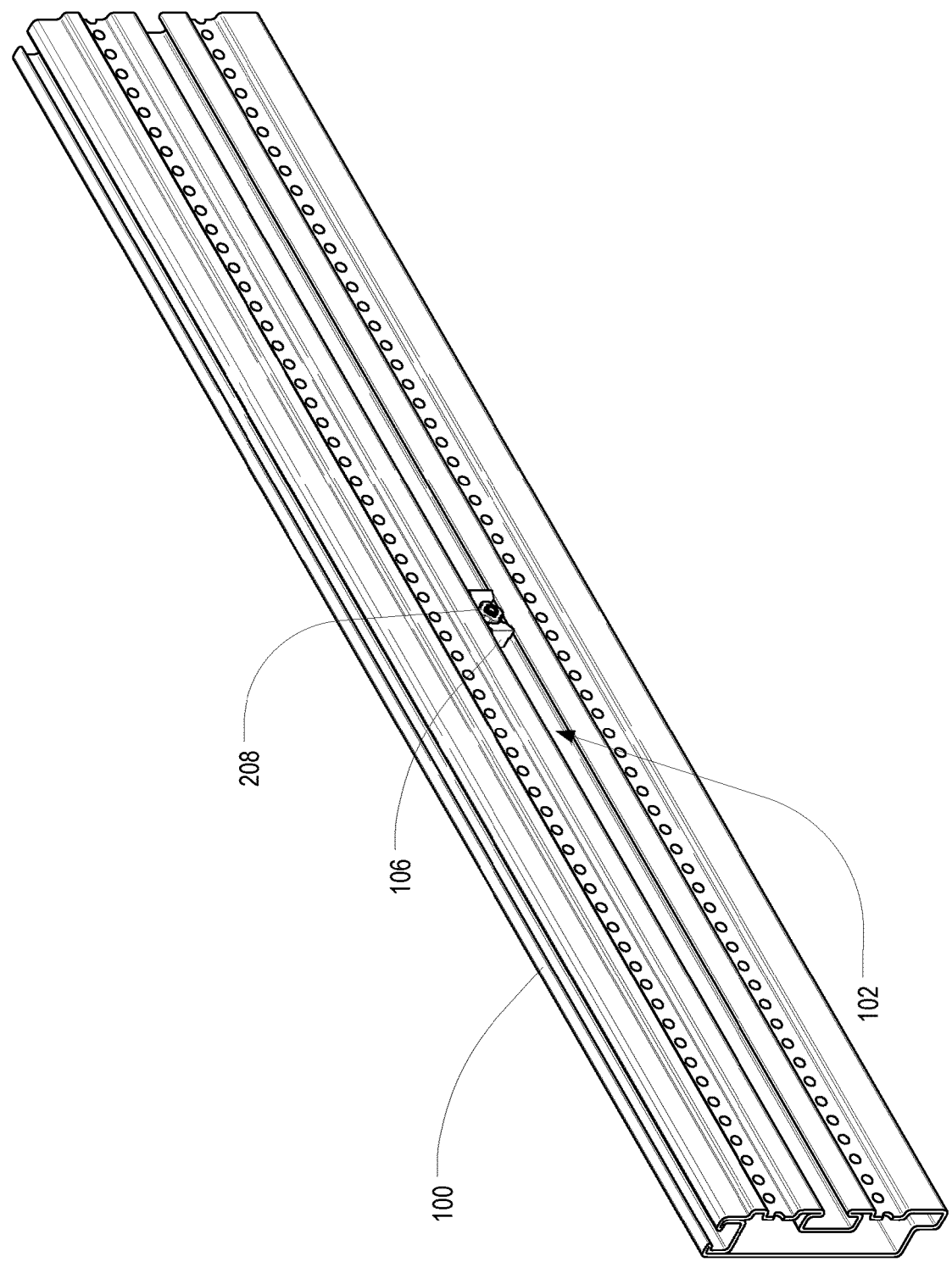
FIG. 22 is an isometric view of a slide-type mounting rail having a nut and spring retainer inserted therein for receiving a bolt in accordance with one or more preferred embodiments of the present invention.

Although presented thus far in the context of a bolt whose head is positioned and retained in a channel 102, it will be appreciated that in alternative embodiments, a nut having many similar characteristics to the bolt head 110 of FIGS. 7-21 may be provided. In this regard, FIG. 22 is an isometric view of a slide-type mounting rail 100 having a nut 208 and spring retainer 106 inserted therein for receiving a bolt in accordance with one or more preferred embodiments of the present invention. It is contemplated that each of the nut 208 and the spring retainer 106 are made from a durable metal material, and that in at least some embodiments the materials are electrically conductive. As described previously, in at least some contemplated embodiments, the slide-type mounting rail 100 has an extruded construction with one or more channels or grooves 102 formed therein for use in accommodating slide hardware. In other contemplated embodiments, the slide-type mounting rail 100 is constructed from steel tubing or formed sheet metal. It is further contemplated that the slide-type mounting rail 100 can include slots, apertures, or other openings formed or machined into different surfaces thereof for accommodating fasteners, accessories, or other types of structural features.

Within the context of electronic equipment enclosures and cabinets, the slide-type mounting rail 100 can function as a structural component of the frame that supports the enclosure or it can serve as an internal or external appurtenant structure, such as an equipment or accessory mounting rail. It is further contemplated that the slide-type mounting rail 100 can be oriented horizontally, vertically, or in any other orientation relative to the enclosure or cabinet. As can be seen in FIG. 22, a nut 208 and a spring retainer 106 in accordance with one or more preferred embodiments of the present invention have been inserted into a centrally-located T-slot channel 102 of the slide-type mounting rail 100.

Figure 23:
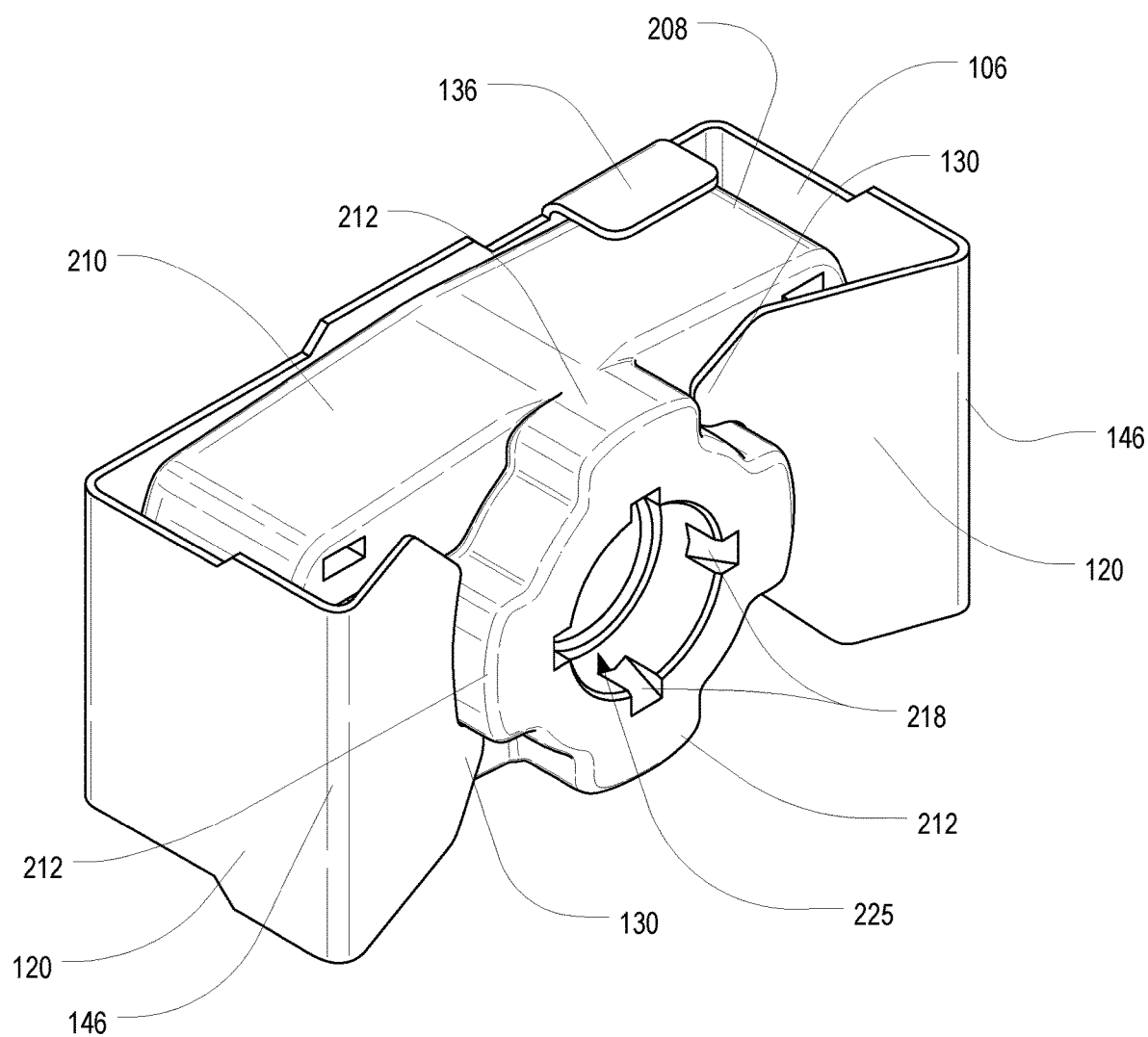
FIG. 23 is an isometric view of the nut and spring retainer of FIG. 22.

FIG. 23 is an isometric view of the nut 208 and spring retainer 106 of FIG. 22. As shown therein, a portion of the nut 208 is retained within the spring retainer 106 by a pair of deflectable spring arms 120. In at least some embodiments, it is contemplated that the nut 208 and spring retainer 106 are provided in a preassembled state where they are paired together in the manner shown in FIG. 23.

Figure 24:
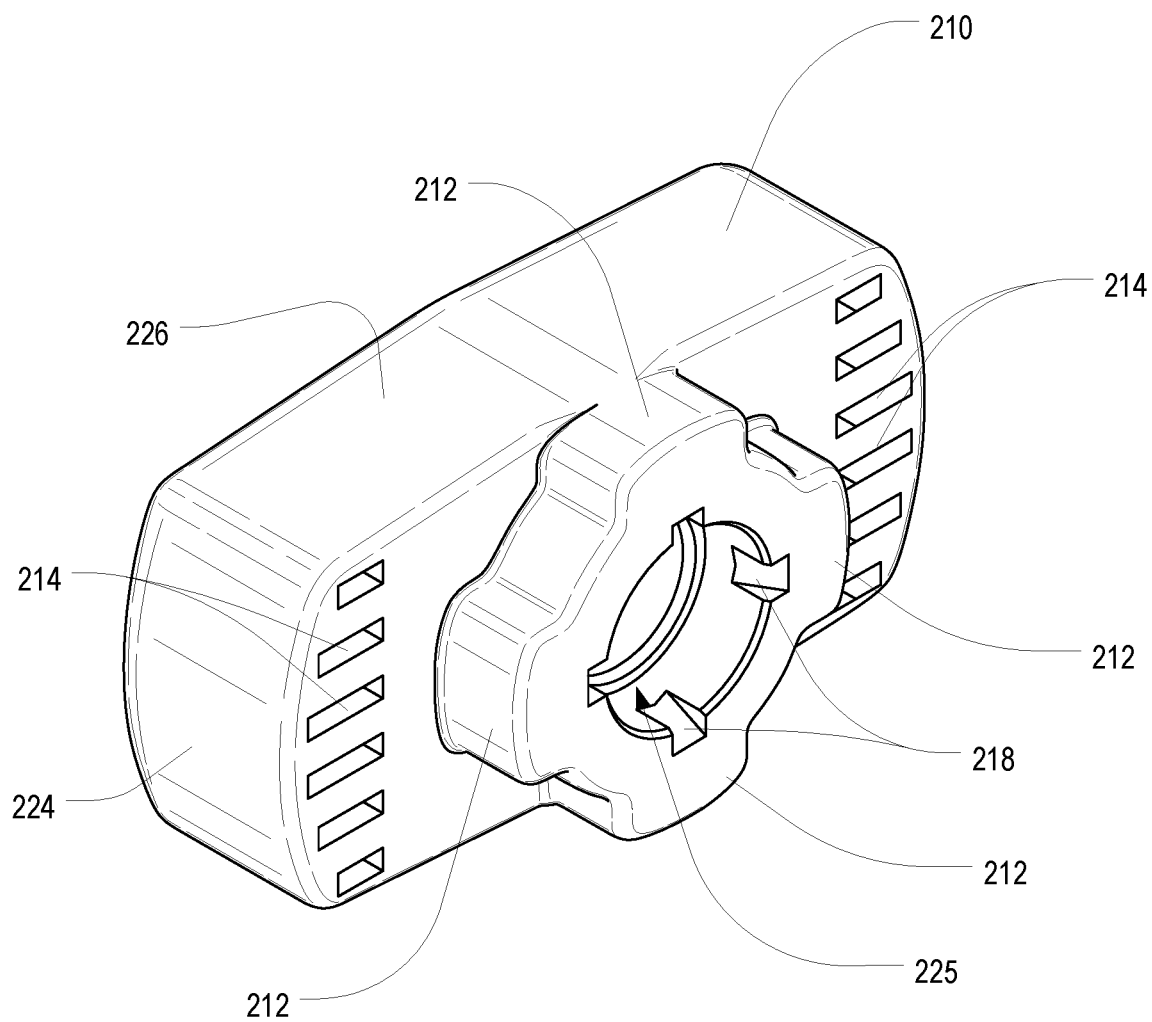
FIG. 24 is an isometric view of the nut of FIG. 23.
Figure 25:
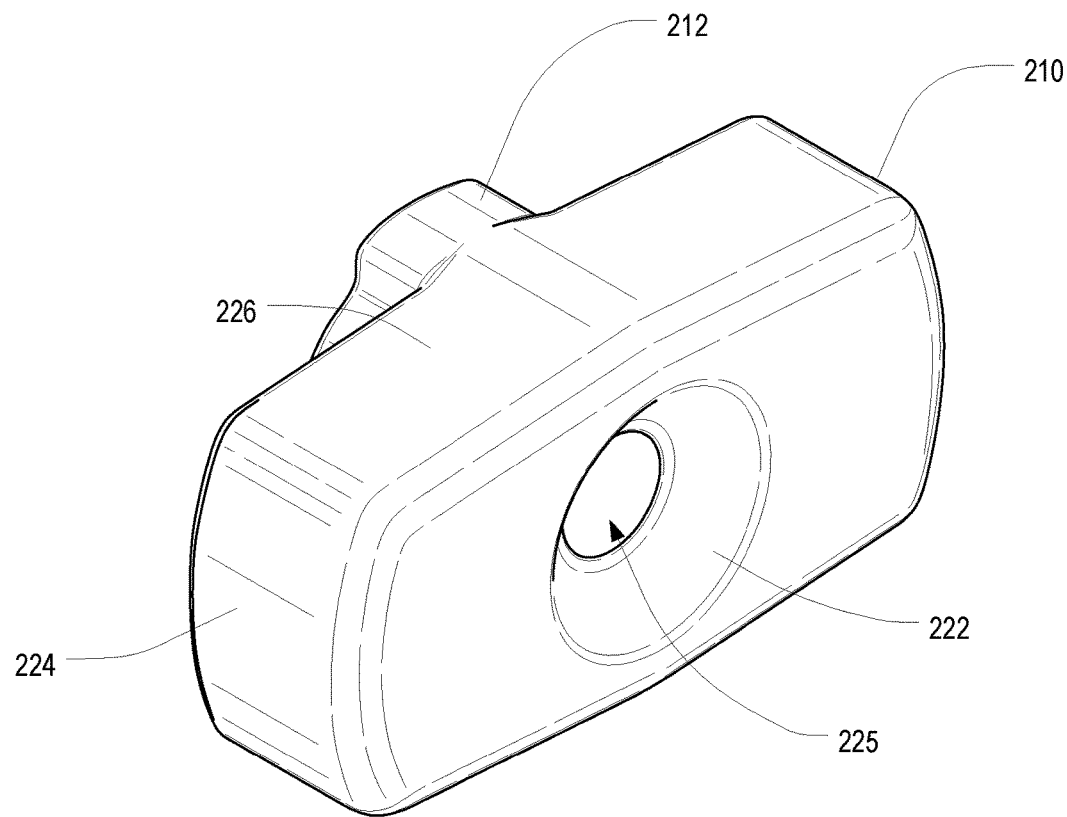
FIG. 25 is a reverse isometric view of the nut of FIG. 24.

FIG. 24 is an isometric view of the nut 208 of FIG. 23, and FIG. 25 is a reverse isometric view of the nut 208 of FIG. 24. The nut 208 includes a body or head 210 featuring a pair of short sides 224 and a pair of long sides 226, which, together, provide the nut head 210 with a generally oblong or rectangular shape. It is contemplated that each of the short and long sides 224,226 may exhibit some degree of curvature or they may exhibit no curvature at all. With reference to FIG. 25, the nut head 210 preferably includes a pivot recess 222 that is centrally located along a rear surface thereof. At an interior of the pivot recess 222 is an aperture 225 that passes through the nut head 210 and is shaped to accommodate a bolt shaft received therethrough. It is contemplated that interior surfaces of the aperture 225 may be threaded to receive a threaded bolt shaft, as described hereinbelow.

With further reference to FIG. 24, the nut 208 further includes a plurality of cam bosses 212 arranged at evenly spaced intervals around the aperture 225 along a front surface of the nut head 210. Each cam boss 212 is generally box-shaped with rounded edges. Each cam boss 212 protrudes from an edge of the nut aperture 225 and remains within the cross-sectional profile of the nut head 210. In the embodiment of FIGS. 24 and 25, the nut 208 includes four cam bosses 212, although more or fewer cam bosses are also contemplated. As further shown in FIG. 24, the nut 208 includes a plurality of notches 218 adjacent the aperture 225 at the front surface of the nut head 210. Each notch 218 is arranged at a quarter turn around the edge of the aperture 225 and the notches are axially aligned therewith. These notches 218 are adapted to interact with a tool, such as a flathead, cross-head, or Phillips head screwdriver, for rotating the nut 208. However, it will be appreciated that other arrangements of notches or recesses may alternatively be provided for interaction with other types of screwdrivers or tools.

With reference to FIG. 24, the nut 208 further includes a series of cutting ribs 214 arranged at opposite sides of the nut head 210 along the front-facing surface thereof. Each cutting rib 214 includes a sharp surface or edge for cutting through the paint or other coating of another metal surface when the ribs are applied against the other metal surface, and, more particularly, when the nut 208 is rotated and tightened against such surface. In this regard, the cutting ribs 214 facilitate a metal-on-metal connection between the nut 208 and the other metal surface.

It is contemplated that the spring retainer 106 for use with the nut 208 may be structurally identical to that which is shown in FIGS. 11 and 12 for use with the bolt 104. As will be explained in greater detail below, the locking cams 130 interact with the cam bosses 212 on the nut 208 to help position the nut relative to the spring retainer 106.

As described previously, the spring retainer 106 includes a pivot boss 132 that is centrally located along a length of the rear wall 138. The pivot boss 132 protrudes in an inward direction and includes a countersunk aperture 134 that penetrates the rear wall 138. Adjacent the aperture 134, edges of the rear wall 138 protrude inward and are adapted to interact with the pivot recess 222 to help position the nut 208 relative to the spring retainer 106. As they do with the bolt 104, the tab stops 136 of the spring retainer 106 prevent the nut 208 from rotating within the spring retainer 106.

With further reference to FIG. 23, the nut 208 is held and aligned within the spring retainer 106 by a variety of features. The spring arms 120 are deflected at least slightly from an undeflected state by cam bosses 212 at opposite sides of the nut 208. The bias of the spring arms 120 against the cam bosses 212 clamps the nut 208 within the spring retainer 106. In particular, the outer surface of each cam boss 212 abuts the concavely curved outer edge 128 of one of the spring arms 120. The nut 208 is retained in an aligned position by the pivot boss 222, which is received within the pivot recess 132 of the spring retainer 106. In particular, seating the pivot boss 222 within the pivot recess 132 ensures that the nut 208 remains centered within the spring retainer 106 even as the nut is rotated. The tab stops 136 arranged on sides of the rear wall 138 and adjacent the spring arms 120 prevent the nut 208 from rotation in a direction blocked by the tab stops 136.

It is contemplated that the nut 208 and spring retainer 106 can be installed in a slide-type mounting rail 100 in a manner very similar to that of the bolt 104 and spring retainer 106. In a contemplated method of installing the nut 208 and spring retainer 106 in a slide-type mounting rail 100, the pre-assembled nut 208 and spring retainer 106 are inserted into a T-slot channel 102 of the mounting rail 100 until the rear wall 138 of the spring retainer 106 reaches the rear wall 142 of the channel. Once received within the T-slot channel 140, bent edges 146 of the spring arms 120 are obstructed by the opposing ledges 144 of the T-slot channel 102. With the bent edges 146 of the spring arms 120 blocked by the ledges 144 of the T-slot channel 102, the spring retainer 106 is prevented from rotation within the channel 102. However, the pre-assembled nut 208 and spring retainer 106 is slidable within the channel along a length thereof to adjust the position of the nut 208 and spring retainer 106.

To lock the nut 208 at a desired location along the mounting rail 100, the nut 208 is rotated ninety degrees, or a quarter turn, in a clockwise direction. It is contemplated that the nut 208 can be rotated using a tool, such as a flathead, cross-head, or Phillips head screwdriver. In particular, it is contemplated that a Phillips head screwdriver can be received in the notches 218 to rotate the nut 208. During rotation of the nut 208, the unengaged cam bosses 212 will press against angled outer edges of the locking cams 130, thereby causing the spring arms 120 to be deflected outward. Once the unengaged cam bosses 212 have cleared the locking cams 130, the spring arms 120 will spring back to clamp against the previously unengaged cam bosses 212 to retain the nut 208. It is contemplated that, as the unengaged cam bosses 212 spring back upon clearing the locking cams 130, the nut 208 clicks or snaps into the locked position or state, thereby providing an installer with confirmation that the nut 208 has been properly locked.

Figure 26:
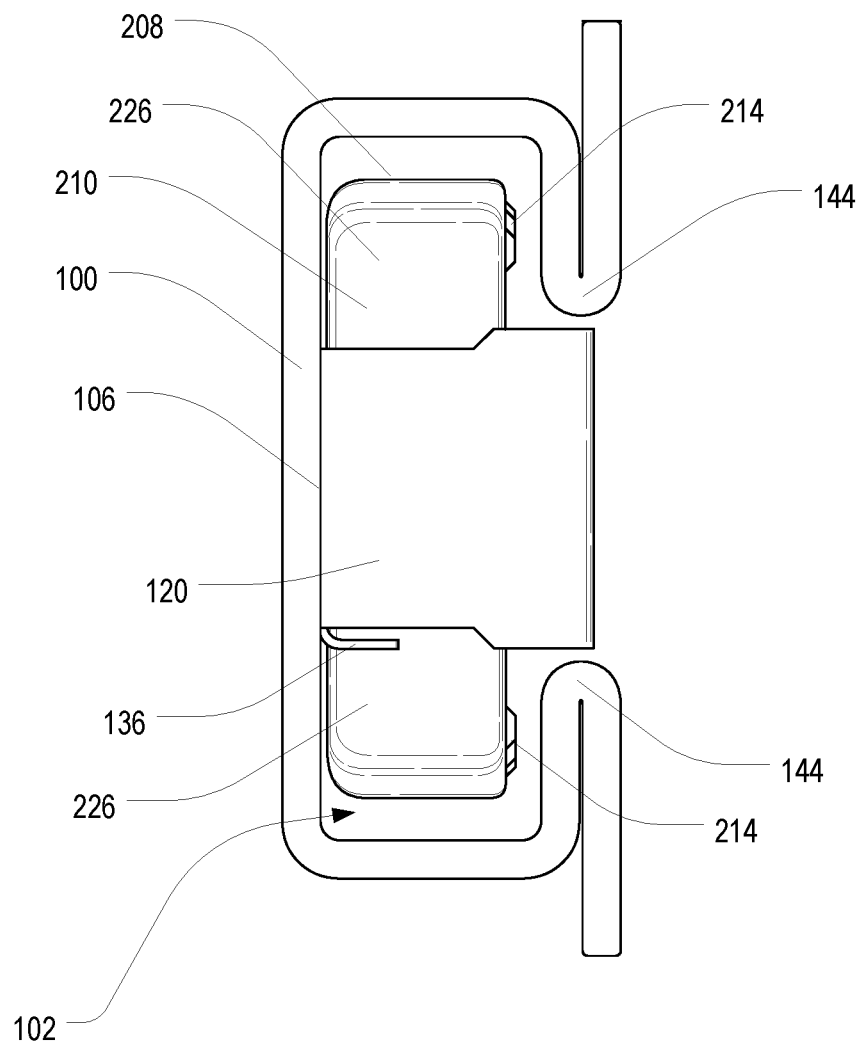
FIG. 26 is a fragmentary end view of the mounting rail, nut, and spring retainer of FIG. 22.

FIG. 26 is a fragmentary end view of the mounting rail 100, nut 208, and spring retainer 106 of FIG. 22. In FIG. 26, the nut 208 has been rotated to the locked position or locked state. When in the locked position or state, the long sides 226 of the nut head 210 are positioned across the T-slot channel 102, thereby preventing the nut 208 from exiting the channel. The tab stops 136 prevent the nut 208 from further rotation in the clockwise direction. Additionally, the locking cams 130 prevent the nut 208 from unintentionally rotating back in the counterclockwise direction.

Figure 27:
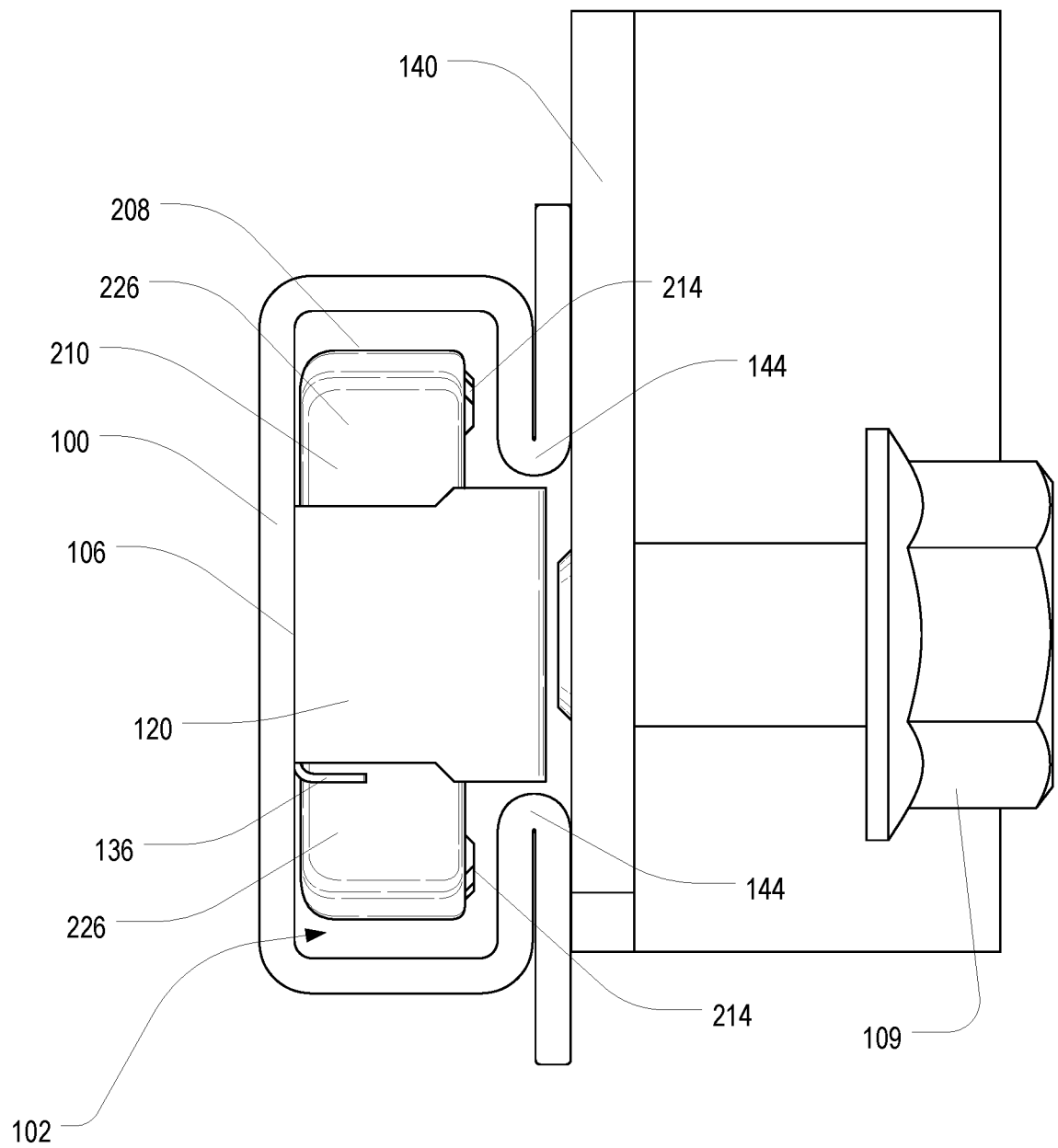
FIG. 27 is a fragmentary end view of the mounting rail, nut, and spring retainer of FIG. 26, shown with a vertical structure placed in position against the mounting rail and a bolt loosely inserted therethrough.
Figure 28:
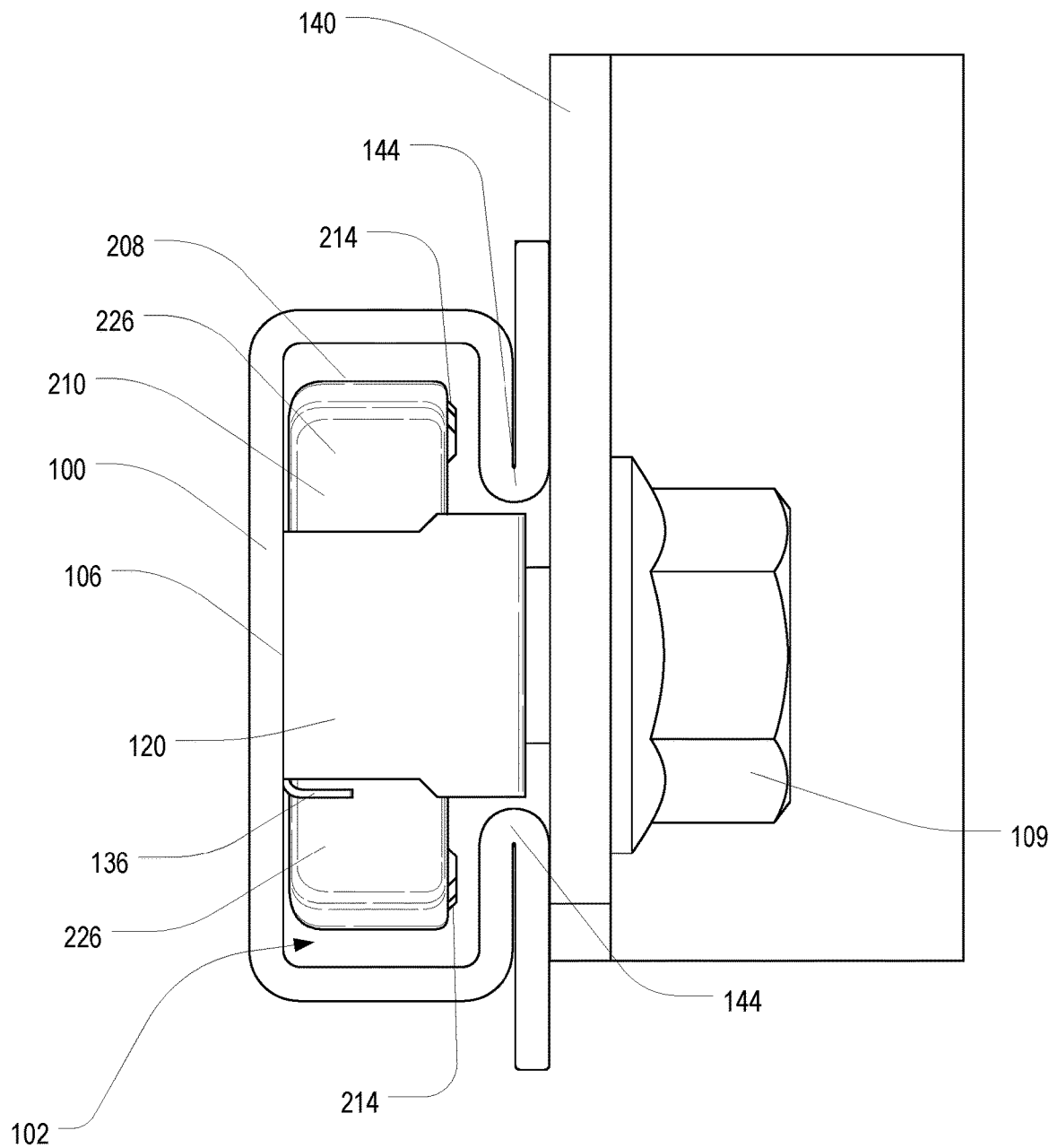
FIG. 28 is a fragmentary end view of the mounting rail, nut, and spring retainer of FIG. 27, shown with the bolt loosely installed in the nut.
Figure 29:
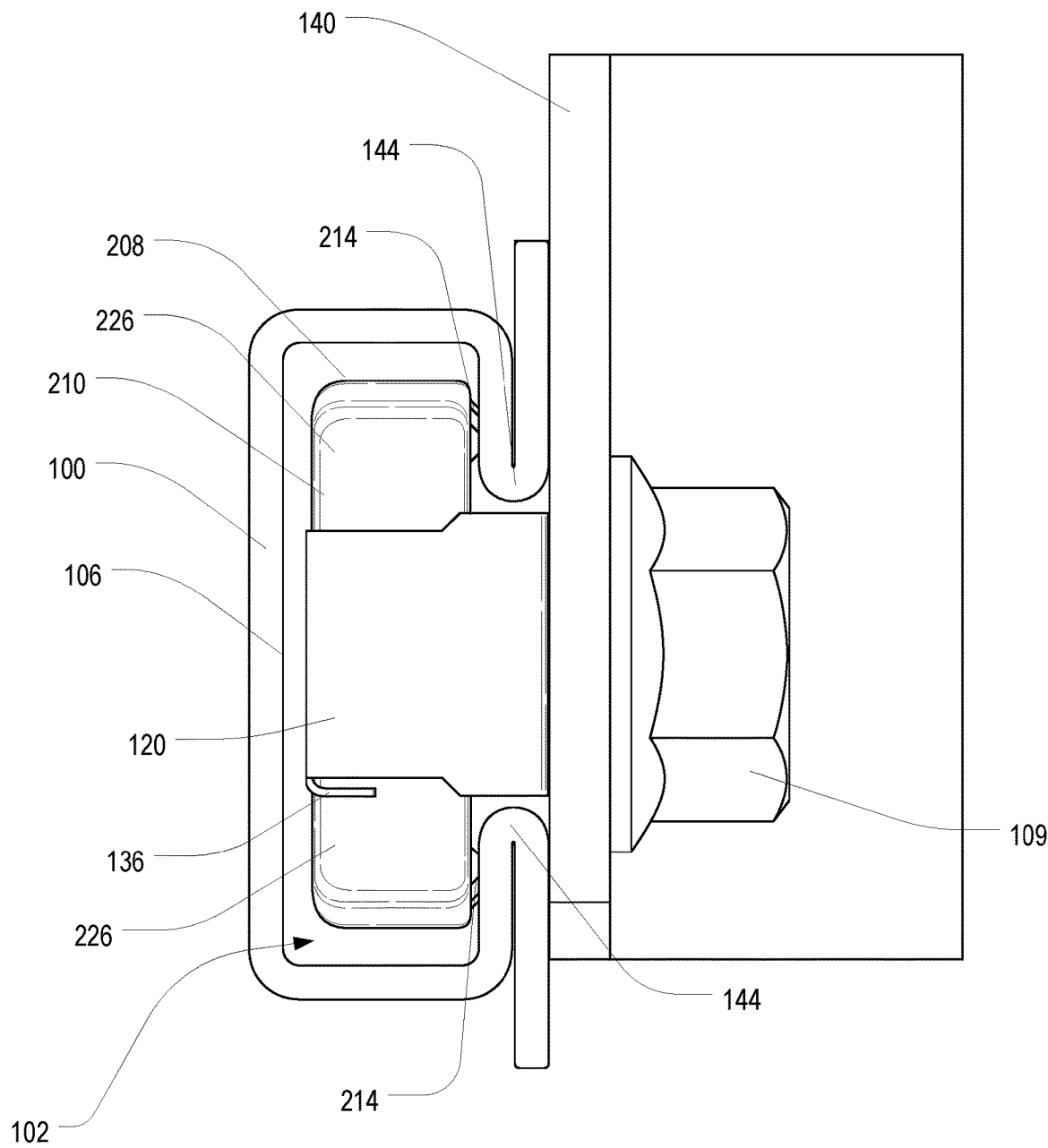
FIG. 29 is a fragmentary end view of the mounting rail, nut, and spring retainer of FIG. 28, shown with the bolt tightened in the nut.

With the nut 208 in the locked position or state, additional structures, such as equipment components, cable management accessories, and structural components can be secured or fastened using the nut 208 in connection with a corresponding bolt. In this regard, FIG. 27 is a fragmentary end view of the mounting rail 100, nut 208, and spring retainer 106 of FIG. 26, shown with a vertical structure 140 placed in position against the mounting rail 100 and a bolt 109 loosely inserted therethrough. In particular, the shaft of the bolt 109 is positioned through an aperture of the structure to be mounted. Then, the bolt 109 is positioned through the aperture 225 of the nut 208 at the front-facing side thereof and is tightened. FIG. 28 is a fragmentary end view of the mounting rail 100, nut 208, and spring retainer 106 of FIG. 27, shown with the bolt 109 loosely installed in the nut 208, and FIG. 29 is a fragmentary end view of the mounting rail 100, nut 208, and spring retainer 106 of FIG. 28, shown with the bolt 109 tightened in the nut 208. As the bolt 109 is tightened, the cutting ribs 214 on the nut head 210 cut through any paint or coating on the interior-facing surface of the T-slot channel 102, thereby establishing metal-on-metal contact between the nut 208 and the mounting rail 100 to facilitate an electrical bonding connection. Additionally, it is contemplated that the bolt 109 may itself have serrated ribs on the contact surface that abuts the structure being mounted, thereby establishing metal-on-metal contact (and electrical bonding) between the bolt 109 and the mounted structure 140. Taken together, the metal-on-metal connections form an electrical bonding path from the structure 140 through the bolt 109, through the nut 208, and to the mounting rail 100.

For a slide-type mounting rail 100 in a horizontal orientation, it is contemplated that the mounting rail 100 is capable of providing load-bearing support. In particular, it is contemplated that a portion of an equipment load is transmittable through the nut 208 upon which the load is directly or indirectly mounted and to the mounting rail 100 at the point where the nut 208 engages the ledge 144 of the T-slot channel 102.

It is contemplated that a nut 208 and spring retainer 106 in accordance with one or more aspects of the present invention can be installed or removed after the enclosure or cabinet has been fully assembled. Furthermore, it is contemplated that the nut 208 and spring retainer 106 can be unlocked to facilitate repositioning of the nut 208 and spring retainer 106 within the channel 102. To unlock the nut 208, the nut can be rotated in a counterclockwise direction. In this regard, it is contemplated that unlocking the nut 208 may require a greater rotational force than what is required to lock the nut during installation.

Each of a bolt and spring retainer and a nut and spring retainer in accordance with one or more aspects of the present invention provide an improvement for attaching an equipment rail or other accessories to enclosure slide-type mounting rails having formed T-slot channels. These assemblies can be easily installed or removed as needed (even after the enclosure frame has been assembled), can be locked into the T-slot channel to prevent the hardware from being inadvertently removed, are capable of sliding freely within the T-slot channel for infinite adjustability along the length of the channel, can electrically bond to the mounting rail automatically when tightened, and can provide for the ability to maneuver or position structures to be mounted within the enclosure prior to finalizing and tightening the hardware. It will be appreciated, however, that any one of these features is believed to be an improvement over existing solutions, and that various embodiments of the present invention do not require all of the features to be present.

Based on the foregoing information, it will be readily understood by those persons skilled in the art that the present invention is susceptible of broad utility and application. Many embodiments and adaptations of the present invention other than those specifically described herein, as well as many variations, modifications, and equivalent arrangements, will be apparent from or reasonably suggested by the present invention and the foregoing descriptions thereof, without departing from the substance or scope of the present invention.

Accordingly, while the present invention has been described herein in detail in relation to one or more preferred embodiments, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements; the present invention being limited only by the claim(s) appended hereto and the equivalents thereof.

What is claimed is:

1. A method of securing a structure against a slide-type mounting rail of an electronic equipment enclosure, the method comprising:
   providing a hardware assembly having a spring retainer and a bolt, a head of which is received at least partially within the spring retainer, wherein,
   the spring retainer includes a rear wall and a deflectable spring arm extending in a forward direction from each end of the rear wall, each spring arm including a distal end that extends inward toward the distal end of the other spring arm,
   the head of the bolt is generally oblong and includes a plurality of cam bosses arranged at a front-facing side thereof,
   each spring arm engages and is partially deflected by a respective one of the cam bosses, thereby clamping the head of the bolt within the spring retainer, and
   a shaft of the bolt protrudes in a forward direction from the spring retainer between the spring arms;
   positioning the hardware assembly within a T-slot channel of the slide-type mounting rail such that bent edges of the deflectable spring arms engage ledges of the T-slot channel to prevent the spring retainer from rotation;
   configuring the bolt from an unlocked position to a locked position by rotating the bolt a quarter turn relative to the spring retainer to position the head transversely within the channel, thereby obstructing the hardware assembly from inadvertent removal from the slide-type mounting rail;
   placing the structure against the slide-type mounting rail such that the shaft extends through an aperture of the structure; and
   tightening a nut onto the shaft such that the nut is pressed firmly against the structure.

2. The method of claim 1, further comprising sliding the hardware assembly within the T-slot channel to adjust a position thereof.

3. The method of claim 1, wherein rotation of the bolt relative to the spring retainer causes the spring arms to be deflected outward until the quarter turn is complete, at which point the spring arms snap back against different respective ones of the plurality of cam bosses.

4. The method of claim 1, wherein each spring arm includes a locking cam at the distal end thereof to prevent the bolt from rotating back to the unlocked position.

5. The method of claim 1, wherein the distal end of each spring arm includes a concavely curved outer edge that engages the respective one of the cam bosses.

6. The method of claim 1, wherein the spring retainer includes a tab stop extending in a forward direction at each side of the rear wall for preventing over-rotation of the bolt.

7. The method of claim 1, wherein the bolt includes a pivot recess at a rear-facing side thereof that interfaces with a pivot boss arranged on the rear wall of the spring retainer to position the bolt relative to the spring retainer.

8. The method of claim 7, wherein the pivot boss is formed at least in part from a countersunk aperture that penetrates the rear wall.

9. The method of claim 1, wherein the bolt includes a plurality of cutting ribs on the front-facing side thereof.

10. The method of claim 9, wherein tightening the nut on the shaft causes the cutting ribs to engage and cut through a painted inner surface of the T-slot channel, thereby establishing metal-on-metal contact between the bolt and the slide-type mounting rail to facilitate electrical bonding.

11. The method of claim 10, wherein an electrical bonding path includes each of the slide-type mounting rail, the bolt, the nut, and the structure.

12. The method of claim 1, wherein the shaft includes a groove along an end surface thereof for indicating whether the bolt has been rotated.

13. The method of claim 1, wherein, when the slide-type mounting rail is oriented horizontally, a lower edge of the bolt engages the slide-type mounting rail such that the slide-type mounting rail provides load-bearing support to the structure.

14. A method of securing a structure against a slide-type mounting rail of an electronic equipment enclosure, the method comprising:
   providing a hardware assembly having a spring retainer and a nut received at least partially within the spring retainer, wherein,
   the spring retainer includes a rear wall and a deflectable spring arm extending in a forward direction from each end of the rear wall, each spring arm including a distal end that extends inward toward the distal end of the other spring arm,
   the nut is generally oblong, has an aperture extending therethrough, and includes a plurality of cam bosses arranged at a front-facing side thereof, and
   each spring arm engages and is partially deflected by a respective one of the cam bosses, thereby clamping the nut at least partially within the spring retainer;
   positioning the hardware assembly within a T-slot channel of the slide-type mounting rail such that bent edges of the deflectable spring arms engage ledges of the T-slot channel to prevent the spring retainer from rotation;
   configuring the nut from an unlocked position to a locked position by rotating the nut a quarter turn relative to the spring retainer, thereby positioning the nut transversely within the channel and obstructing the hardware assembly from inadvertent removal from the slide-type mounting rail;
   positioning a shaft of a bolt through an aperture of the structure and through the aperture of the nut; and
   tightening the bolt relative to the nut to bring the front-facing side of the nut into engagement with the T-slot channel.

15. The method of claim 14, further comprising sliding the hardware assembly within the T-slot channel to adjust a position thereof.

16. The method of claim 14, wherein rotation of the nut relative to the spring retainer causes the spring arms to be deflected outward until the quarter turn is complete, at which point the spring arms snap back against different respective ones of the plurality of cam bosses.

17. The method of claim 14, wherein each spring arm includes a locking cam at the distal end thereof to prevent the nut from rotating back to the unlocked position.

18. The method of claim 14, wherein the distal end of each spring arm includes a concavely curved outer edge that engages the respective one of the cam bosses.

19. The method of claim 14, wherein the spring retainer includes a tab stop extending in a forward direction at each side of the rear wall for preventing over-rotation of the nut.

20. The method of claim 14, wherein the nut includes a pivot recess at a rear-facing side thereof that interfaces with a pivot boss arranged on the rear wall of the spring retainer to position the nut relative to the spring retainer.

21. The method of claim 20, wherein the pivot boss is formed at least in part from a countersunk aperture that penetrates the rear wall.

22. The method of claim 14, wherein the nut includes a plurality of cutting ribs on the front-facing side thereof.

23. The method of claim 22, wherein tightening the bolt relative to the nut to bring the front-facing side of the nut into engagement with the T-slot channel causes the cutting ribs to engage and cut through a painted inner surface of the T-slot channel, thereby establishing metal-on-metal contact between the nut and the slide-type mounting rail to facilitate electrical bonding.

24. The method of claim 23, wherein an electrical bonding path includes each of the slide-type mounting rail, the nut, the bolt, and the structure.

25. The method of claim 14, wherein the nut includes a plurality of notches to accommodate a tool for rotating the nut relative to the spring retainer.

* * * * *